US012782009B2

(12) United States Patent
Irikura et al.

(10) Patent No.: US 12,782,009 B2
(45) Date of Patent: Nov. 3, 2026

(54) TEMPERATURE ADJUSTMENT DEVICE

(71) Applicant: KELK Ltd., Kanagawa (JP)

(72) Inventors: Hiroki Irikura, Kanagawa (JP); Atsushi Kobayashi, Kanagawa (JP); Koji Maeda, Kanagawa (JP); Satoshi Shirahata, Kanagawa (JP)

(73) Assignee: KELK Ltd., Kanagawa (JP)

( * ) Notice: Subject to any disclaimer, the term of this patent is extended or adjusted under 35 U.S.C. 154(b) by 288 days.

(21) Appl. No.: 18/699,685

(22) PCT Filed: Nov. 25, 2022

(86) PCT No.: PCT/JP2022/043544

§ 371 (c)(1),
(2) Date: Sep. 19, 2024

(87) PCT Pub. No.: WO2023/095873

PCT Pub. Date: Jun. 1, 2023

(65) Prior Publication Data

US 2025/0012488 A1 Jan. 9, 2025

(30) Foreign Application Priority Data

Nov. 26, 2021 (JP) .................................. 2021192156

(51) Int. Cl.
*F25B 21/04* (2006.01)
*F28F 3/12* (2006.01)
*H10P 72/00* (2026.01)

(52) U.S. Cl.
CPC ................ *F25B 21/04* (2013.01); *F28F 3/12* (2013.01); *F28F 2230/00* (2013.01); *H10P 72/0414* (2026.01)

(58) Field of Classification Search
CPC ......... F25B 21/04; F28F 3/12; F28F 2230/00; H10P 72/0414
(Continued)

(56) References Cited

U.S. PATENT DOCUMENTS 10,845,375 B2 * 11/2020 Sommer ................ F25B 21/00
11,145,571 B2 * 10/2021 Yoo ....................... H05K 7/209
(Continued)

FOREIGN PATENT DOCUMENTS

JP 2011-077145 A 4/2011
JP 2020-085260 A 6/2020
(Continued)

OTHER PUBLICATIONS

International Search Report in International Appln. No. PCT/JP2022/043544, mailed Dec. 27, 2022, 5 pages (with English translation).

*Primary Examiner* — Claire E Rojohn, III
(74) *Attorney, Agent, or Firm* — Fish & Richardson P.C.

(57) ABSTRACT

A temperature adjustment device includes: a pair of channel plates each of which has a front surface and a channel groove provided in at least a part of the front surface; a pair of heat transfer plates that respectively faces the channel grooves respectively provided in the pair of channel plates; a seal member that seals a boundary between the front surface of each of the channel plates and each of the heat transfer plates; a spacer member arranged to face back surfaces of the channel plates and arranged in at least a part of a region immediately below the seal member; and a fastening member that fastens the pair of channel plates and the pair of heat transfer plates in an overlapped state, where the spacer member has higher compressive strength than the channel plates.

17 Claims, 20 Drawing Sheets

(58) Field of Classification Search
USPC .......................................................... 165/170
See application file for complete search history.

(56) References Cited

U.S. PATENT DOCUMENTS

| | | | | |
|---|---|---|---|---|
| 11,908,766 | B2 * | 2/2024 | Choi ..................... | H10W 40/22 |
| 11,955,353 | B2 * | 4/2024 | Kobayashi .............. | F25B 21/02 |
| 11,978,621 | B2 * | 5/2024 | Kobayashi .............. | F25B 21/02 |
| 12,132,010 | B2 * | 10/2024 | Coppola .................. | B60K 1/04 |
| 12,408,309 | B2 * | 9/2025 | Apelsmeier ............ | H05K 7/209 |
| 2003/0172657 | A1 * | 9/2003 | Ohkubo .................. | F25B 21/04<br>62/3.2 |
| 2011/0299244 | A1 * | 12/2011 | Dede ....................... | F28F 13/08<br>361/689 |
| 2011/0317368 | A1 * | 12/2011 | Pautsch ................. | H10W 40/47<br>361/702 |
| 2021/0358776 | A1 * | 11/2021 | Kobayashi .......... | H10P 72/0402 |
| 2021/0398799 | A1 * | 12/2021 | Kobayashi .............. | H10P 70/15 |

FOREIGN PATENT DOCUMENTS

| | | | |
|---|---|---|---|
| JP | 2020-087979 | A | 6/2020 |
| KR | 10-2021-0062071 | A | 5/2021 |

* cited by examiner

TEMPERATURE ADJUSTMENT DEVICE

CROSS-REFERENCE TO RELATED APPLICATIONS

This application is a National Stage application of International Application No. PCT/JP2022/043544, filed on Nov. 25, 2022, which claims priority to Japanese Patent Application No. 2021-192156, filed on Nov. 26, 2021. The contents of the prior applications are incorporated herein in their entirety.

FIELD

The present invention relates to a temperature adjustment device.

BACKGROUND

A semiconductor device is manufactured through a plurality of processes such as a cleaning process of cleaning a semiconductor wafer, an application process of applying a photoresist to the semiconductor wafer, an exposure process of exposing the semiconductor wafer to which the photoresist is applied, and an etching process of etching the semiconductor wafer after the exposure. In the cleaning process, the semiconductor wafer is cleaned with temperature-adjusted liquid. Patent Literature 1 discloses an example of a temperature adjustment device that adjusts a temperature of liquid.

CITATION LIST

Patent Literature

Patent Literature 1: Japanese Patent Application Laid-open No. 2020-087979

SUMMARY

Technical Problem

In a case where the technology described in Patent Literature 1 is applied, resin is used as a channel plate that is a heat exchange block of a temperature adjustment device, and the resin is a material that is likely to undergo creep deformation, there is a possibility that large creep deformation due to a time-dependent load is generated.

An object of an aspect of the present invention is to control creep deformation due to a time-dependent load.

Solution to Problem

In order to achieve an aspect of the present invention, a temperature adjustment device comprises: a pair of channel plates each of which has a front surface and a channel groove provided in at least a part of the front surface; a pair of heat transfer plates that respectively faces the channel grooves respectively provided in the pair of channel plates; a seal member that seals a boundary between the front surface of each of the channel plates and each of the heat transfer plates; a spacer member arranged to face back surfaces of the channel plates and arranged in at least a part of a region immediately below the seal member; and a fastening member that fastens the pair of channel plates and the pair of heat transfer plates in an overlapped state, wherein the spacer member has higher compressive strength than the channel plates.

Advantageous Effects of Invention

According to an aspect of the present invention, creep deformation due to a time-dependent load can be controlled.

DESCRIPTION OF EMBODIMENTS

Although embodiments according to the present invention will be described hereinafter with reference to the drawings, the present invention is not limited thereto. Components of the embodiments described in the following can be arbitrarily combined. Also, there is a case where a part of the components is not used.

In the following description, an XYZ Cartesian coordinate system is set, and a positional relationship of each part will be described with reference to this XYZ Cartesian coordinate system. A direction parallel to an X axis in a predetermined plane is assumed as an X-axis direction. A direction parallel to a Y axis orthogonal to the X axis in the predetermined plane is assumed as a Y-axis direction. A direction parallel to a Z-axis orthogonal to the predetermined plane is assumed as a Z-axis direction. An XY plane including the X axis and the Y axis is parallel to the predetermined plane. A YZ plane including the Y axis and the Z axis is orthogonal to the XY plane. An XZ plane including the X axis and the Z axis is orthogonal to each of the XY plane and the YZ plane. In the embodiment, the XY plane is parallel to a horizontal plane. The Z-axis direction is a vertical direction. A +Z direction (+Z side) is an upward direction (upper side). A −Z direction (−Z side) is a downward direction (lower side). Note that the XY plane may be inclined with respect to the horizontal plane.

First Embodiment

<Cleaning System>

Figure 1:
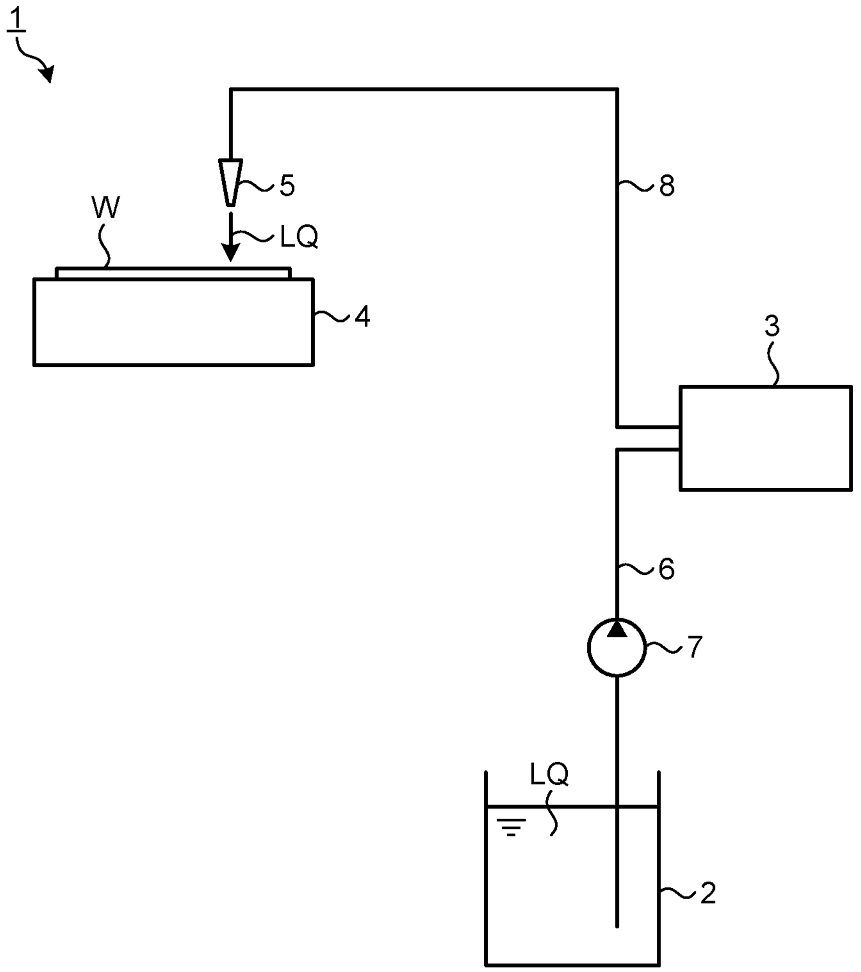
FIG. 1 is a view schematically illustrating an example of a cleaning system according to a first embodiment.

The embodiment will be described. FIG. 1 is a view schematically illustrating an example of a cleaning system 1 according to the first embodiment. The cleaning system 1 cleans a substrate W to be cleaned by using a cleaning liquid LQ. The substrate W includes, for example, a semiconductor wafer. The liquid LQ is, for example, pure water or a liquid chemical. The liquid chemical is, for example, ammonia hydrogen peroxide, hydrochloric acid hydrogen peroxide, or sulfuric acid hydrogen peroxide.

The cleaning system 1 includes a storage tank 2, a temperature adjustment device 3, a substrate holding member 4, a nozzle 5, a first connection pipe 6, a pump 7, and a second connection pipe 8. The storage tank 2 stores the liquid LQ. The temperature adjustment device 3 adjusts a temperature of the liquid LQ supplied from the storage tank 2. The substrate holding member 4 holds the substrate W. The nozzle 5 supplies the liquid LQ the temperature of which is adjusted by the temperature adjustment device 3 to the substrate W. The first connection pipe 6 connects the storage tank 2 and the temperature adjustment device 3. The pump 7 is arranged in the first connection pipe 6. The second connection pipe 8 connects the temperature adjustment device 3 and the nozzle 5. In the cleaning system 1 configured in such a manner, the liquid LQ stored in the storage tank 2 is supplied to the temperature adjustment device 3 via the first connection pipe 6 when the pump 7 is driven. The liquid LQ the temperature of which is adjusted by the temperature adjustment device 3 is supplied to the nozzle 5 via the second connection pipe 8. When the liquid LQ is supplied from the nozzle 5, the substrate W is cleaned.

<Temperature Adjustment Device>

Figure 2:
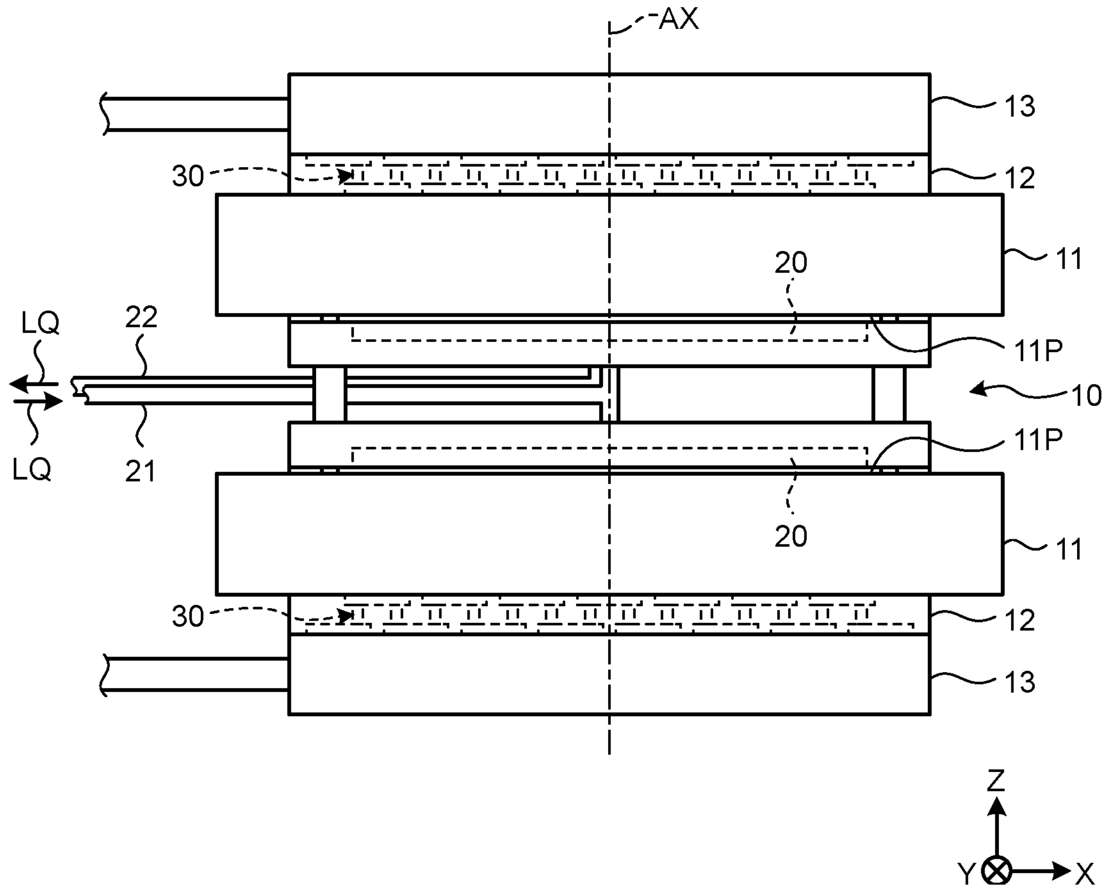
FIG. 2 is a side view schematically illustrating an example of a temperature adjustment device according to the first embodiment.

FIG. 2 is a side view schematically illustrating an example of the temperature adjustment device 3 according to the first embodiment. As illustrated in FIG. 2, the temperature adjustment device 3 includes a main body 10, a pair of heat transfer plates 11, thermoelectric module plates 12, and a pair of heat exchange plates 13.

The main body 10 has a channel 20 through which the liquid LQ flows. The channel 20 is provided in each of an upper surface and a lower surface of the main body 10. The channels 20 respectively face the heat transfer plates 11. The main body 10 is made of, for example, polytetrafluoroethylene (PTFE), perfluoroalkoxy alkane (PFA), or polyvinylidene fluoride (PVDF).

The channels 20 are connected to a supply pipe 21 and a discharge pipe 22. The supply pipe 21 and the discharge pipe 22 are made of PTFE or PFA. The liquid LQ supplied to the channels 20 flows through the supply pipe 21 and is discharged to the discharge pipe 22. The supply pipe 21 is connected to the storage tank 2 via the first connection pipe 6. The supply pipe 21 supplies the liquid LQ in the storage tank 2 to the channels 20. The discharge pipe 22 is connected to the nozzle 5 via the second connection pipe 8. The liquid LQ the temperature of which is adjusted by the temperature adjustment device 3 is supplied to the nozzle 5 via the discharge pipe 22.

The heat transfer plates 11 exchange heat with the liquid LQ flowing through the channels 20 via corrosion-resistant plates 11P, respectively. The heat transfer plates 11 are respectively connected to the upper surface and the lower surface of the main body 10 via the corrosion-resistant plates 11P. The heat transfer plates 11 include one heat transfer plate 11 facing the upper surface of the main body 10, and the other heat transfer plate 11 facing the lower surface of the main body 10. The heat transfer plates 11 are made of, for example, aluminum.

The corrosion-resistant plates 11P include, for example, amorphous carbon. The corrosion-resistant plates 11P have corrosion resistance to the acid or alkaline liquid LQ. The corrosion-resistant plates 11P have thermal conductivity.

The thermoelectric module plates 12 absorb heat or generate heat, and adjust the temperature of the liquid LQ flowing through the channels 20. The thermoelectric module plates 12 are respectively connected to the one heat transfer plate 11 and the other heat transfer plate 11. The thermoelectric module plates 12 include one thermoelectric module plate 12 connected to an upper surface of the one heat transfer plate 11 and the other thermoelectric module plate 12 connected to a lower surface of the other heat transfer plate 11.

Figure 3:
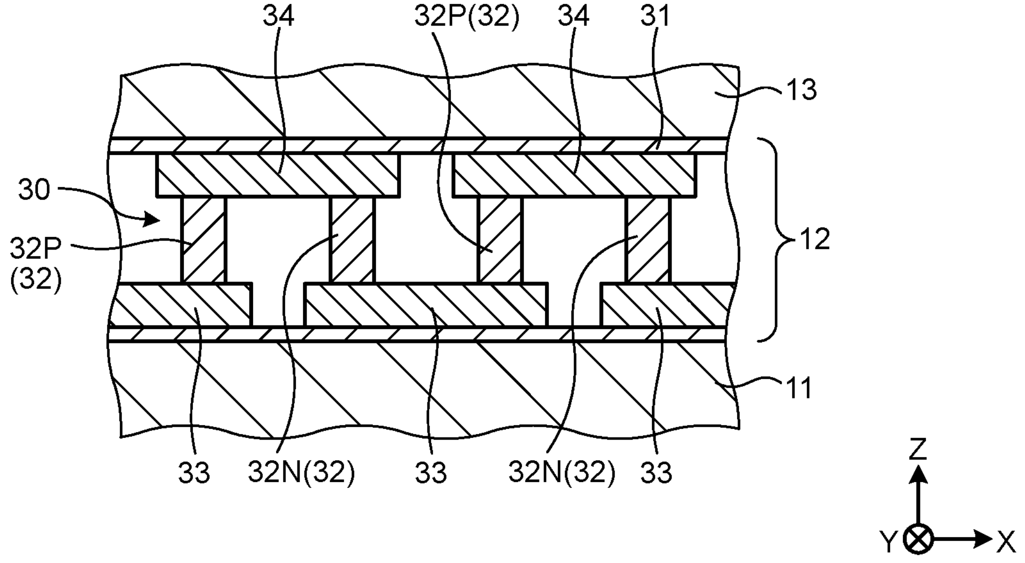
FIG. 3 is a partially-enlarged cross-sectional view of a thermoelectric module plate according to the first embodiment.

FIG. 3 is a partially-enlarged cross-sectional view of the thermoelectric module plate 12 according to the first embodiment. As illustrated in FIG. 3, the thermoelectric module plate 12 includes a plurality of thermoelectric modules 30 and a case 31. The case 31 houses the plurality of thermoelectric modules 30. The case 31 is made of an insulating material.

The thermoelectric modules 30 absorb heat or generate heat by supply of electric power. The thermoelectric modules 30 absorb heat or generate heat by the Peltier effect. The thermoelectric modules 30 take heat from the liquid LQ flowing through the channels 20 or apply heat to the liquid LQ flowing through the channels 20 via the heat transfer plates 11. The thermoelectric modules 30 absorb heat or generate heat, and adjust the temperature of the liquid LQ flowing through the channels 20.

Each of the thermoelectric modules 30 includes a thermoelectric semiconductor element 32, a first electrode 33, and a second electrode 34. The thermoelectric semiconductor element 32 includes a p-type thermoelectric semiconductor element 32P and an n-type thermoelectric semiconductor element 32N. In the XY plane, the p-type thermoelectric semiconductor element 32P and the n-type thermoelectric semiconductor element 32N are alternately arranged. The first electrode 33 is connected to each of the p-type thermoelectric semiconductor element 32P and the n-type thermoelectric semiconductor element 32N. The second electrode 34 is connected to each of the p-type thermoelectric semiconductor element 32P and the n-type thermoelectric semiconductor element 32N. The first electrode 33 is adjacent to the heat transfer plate 11. The second electrode 34 is adjacent to the heat exchange plate 13. Each of one end surface of the p-type thermoelectric semiconductor element 32P and one end surface of the n-type thermoelectric semiconductor element 32N is connected to the first electrode 33. Each of the other end surface of the p-type thermoelectric semiconductor element 32P and the other end surface of the n-type thermoelectric semiconductor element 32N is connected to the second electrode 34.

When a potential difference is applied between the first electrode 33 and the second electrode 34, charges move in the thermoelectric semiconductor element 32. Heat moves in the thermoelectric semiconductor element 32 by the movement of the charges. Thus, the thermoelectric module 30 absorbs heat or generates heat. For example, when the potential difference is applied between the first electrode 33 and the second electrode 34 in such a manner that the first electrode 33 generates heat and the second electrode 34 absorbs heat, the liquid LQ flowing through the channel 20 is heated. When the potential difference is applied between the first electrode 33 and the second electrode 34 in such a manner that the first electrode 33 absorbs heat and the second electrode 34 generates heat, the liquid LQ flowing through the channel 20 is cooled.

The heat exchange plates 13 exchange heat with the thermoelectric module plates 12. The heat exchange plates 13 are respectively connected to the one thermoelectric module plate 12 and the other thermoelectric module plate 12. The heat exchange plates 13 include one heat exchange plate 13 connected to an upper surface of the one thermoelectric module plate 12 and the other heat exchange plate 13 connected to a lower surface of the other thermoelectric module plate 12. Each of the heat exchange plates 13 has an internal channel (not illustrated) through which a temperature adjustment fluid flows. The temperature adjustment fluid flows into the internal channel from an inlet of the internal channel after temperature adjustment by a fluid temperature adjustment device (not illustrated). The temperature adjustment fluid flows through the internal channel, and takes heat from the heat exchange plate 13 or apply heat to the heat exchange plate 13. The temperature adjustment fluid flows out from an outlet of the internal channel and is returned to the fluid temperature adjustment device.

In the embodiment, each of the main body 10, the heat transfer plates 11, the thermoelectric module plates 12, and the heat exchange plates 13 has a substantially disk shape. In the following description, a virtual axis that passes through the center of each of the main body 10, the heat transfer plates 11, the thermoelectric module plates 12, and the heat exchange plates 13 and that is parallel to the Z axis is appropriately referred to as a central axis AX.

<Main Body>

Figure 4:
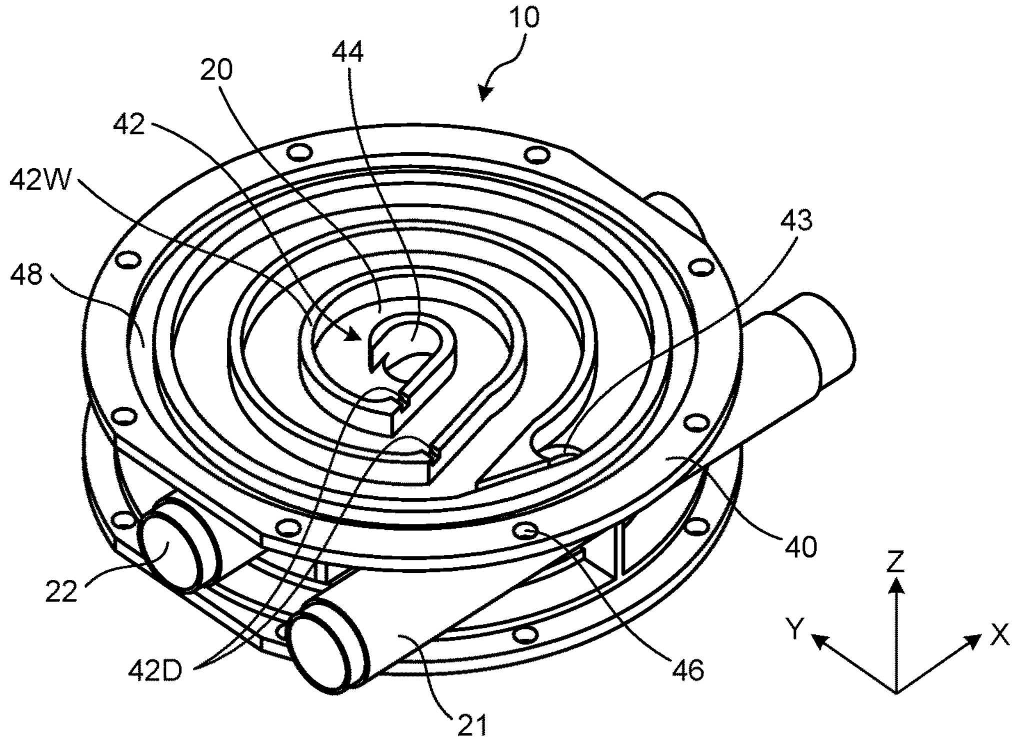
FIG. 4 is a perspective view illustrating an example of a main body of the temperature adjustment device according to the first embodiment.
Figure 5:
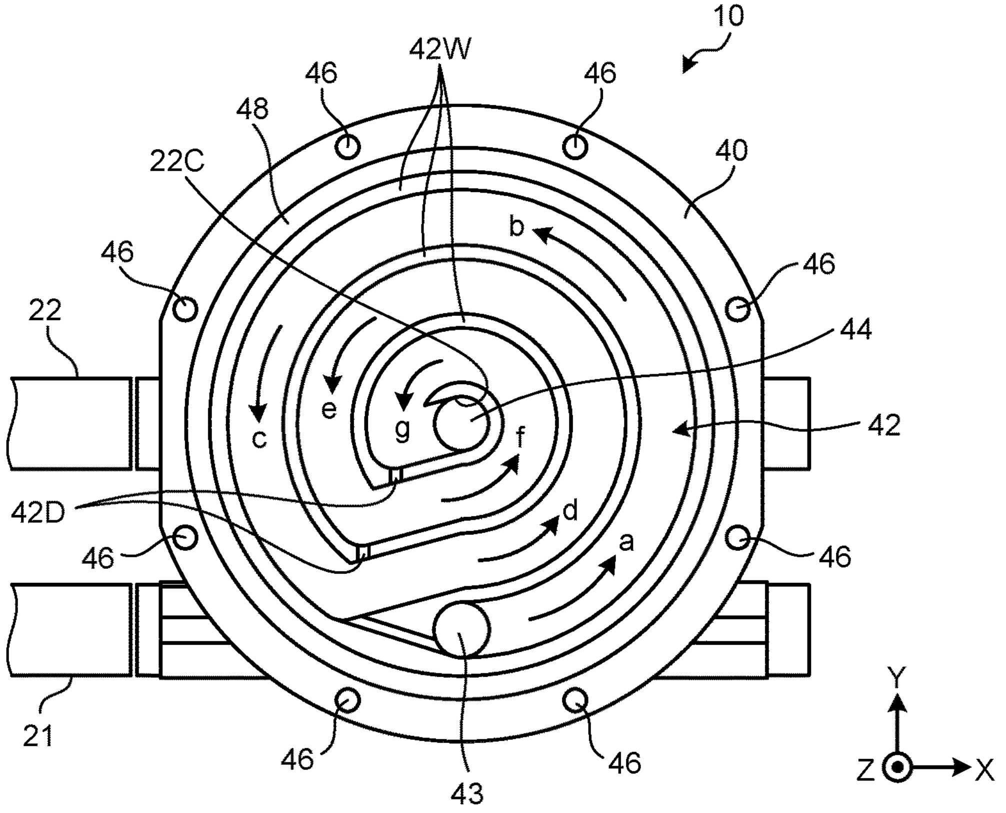
FIG. 5 is a plan view illustrating the example of the main body of the temperature adjustment device according to the first embodiment.
Figure 6:
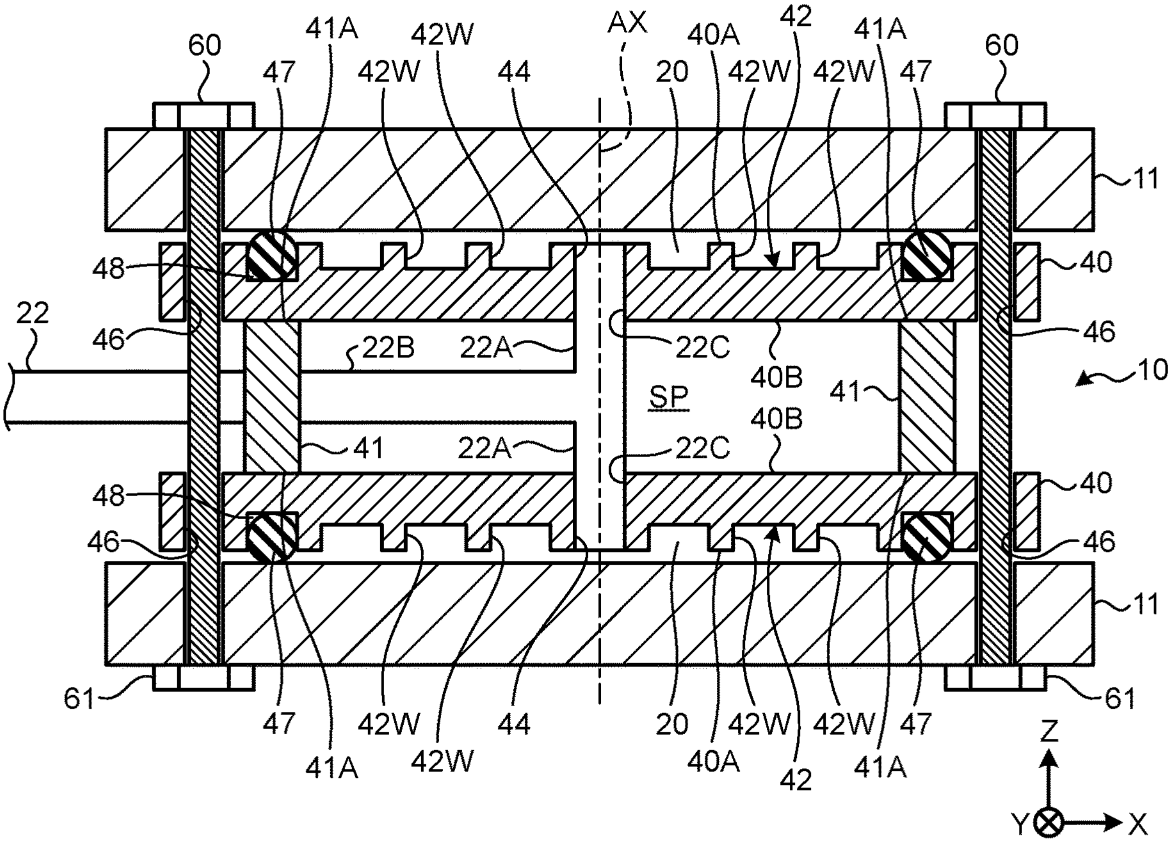
FIG. 6 is a cross-sectional view illustrating the example of the main body of the temperature adjustment device according to the first embodiment.

FIG. 4 is a perspective view illustrating an example of the main body 10 of the temperature adjustment device 3 according to the first embodiment. FIG. 5 is a plan view illustrating the example of the main body 10 of the temperature adjustment device 3 according to the first embodiment. FIG. 6 is a cross-sectional view illustrating the example of the main body 10 of the temperature adjustment device 3 according to the first embodiment. In FIG. 6, a pair of channel plates 40 and the heat transfer plates 11 are illustrated in a manner of being separated from each other for the sake of description. As illustrated in FIG. 4, FIG. 5, and FIG. 6, the main body 10 includes the pair of channel plates 40, a spacer member 41, and a seal member 47.

One of the channel plates 40 has a front surface 40A and a back surface 40B. The one channel plate 40 faces the one heat transfer plate 11. The other channel plate 40 faces the other heat transfer plate 11. The pair of heat transfer plates 11 and the pair of channel plates 40 are fixed by bolts 60 and nuts 61 (see FIG. 12) which are fastening members. The one channel plate 40 and the other channel plate 40 are configured in the same manner. Hereinafter, the one channel plate 40 will be mainly described, and a description of the other channel plate 40 will be simplified or omitted.

The channel plate 40 has a channel groove 42 provided in at least a part of the front surface 40A. The channel groove 42 is provided in the front surface 40A of the channel plate 40. The channel groove 42 is formed in a central portion of the front surface 40A. The channel groove 42 is defined by partition walls 42W. The channel groove 42 is defined between a pair of the partition walls 42W. In the embodiment, the partition walls 42W are provided in a spiral shape. A recess portion 42D connecting the adjacent channel grooves 42 is provided in a part of the partition walls 42W. The recess portion 42D is formed in such a manner as to cut out a part of end surfaces of the partition walls 42W. The heat transfer plate 11 faces the channel groove 42. In a state in which the heat transfer plate 11 faces the channel groove 42, the end surfaces of the partition walls 42W are in contact with the heat transfer plate 11. The channel groove 42 is covered with the heat transfer plate 11, and the end surfaces of the partition walls 42W and the heat transfer plate 11 come into contact with each other, whereby the channel 20 is formed.

The channel plate 40 is made of, for example, PTFE, PFA, or PVDF.

The channel plate 40 has a fluid supply port 43 and a fluid discharge port 44. The fluid supply port 43 supplies the liquid LQ to the channel groove 42. The fluid discharge port 44 discharges at least a part of the liquid LQ in the channel groove 42. The fluid supply port 43 is arranged outside the fluid discharge port 44 in a radiation direction of the central axis AX. At least a part of the fluid discharge port 44 is arranged on the central axis AX of the channel plate 40. A spiral channel groove 42 is formed by connection between the fluid supply port 43 and the fluid discharge port 44.

The channel plate 40 has a hole 46 penetrating in a thickness direction. The hole 46 is arranged outside a seal groove 48 in a radial direction of the channel plate 40. In the embodiment, eight holes 46 are arranged at equal intervals in a circumferential direction. The bolts 60 and the nuts 61 are inserted into the holes 46.

The main body 10 includes the supply pipe 21 and the discharge pipe 22. The liquid LQ supplied to the channel groove 42 flows through the supply pipe 21. At least a part of the supply pipe 21 is arranged in a space SP between the one channel plate 40 and the other channel plate 40. The supply pipe 21 includes a collecting pipe, and branch pipes respectively connected to the fluid supply port 43 of the one channel plate 40 and the fluid supply port 43 of the other channel plate 40. An outlet of the branch pipe and the fluid supply port 43 are connected.

As illustrated in FIG. 6, the liquid LQ discharged from the channel groove 42 flows through the discharge pipe 22. At least a part of the discharge pipe 22 is arranged in the space SP between the one channel plate 40 and the other channel plate 40. The discharge pipe 22 includes branch pipes 22A respectively connected to the fluid discharge port 44 of the one channel plate 40 and the fluid discharge port 44 of the other channel plate 40, and a collecting pipe 22B connected to the pair of branch pipes 22A. Inlets 22C of the branch pipes 22A and the fluid discharge ports 44 are connected. At least a part of the inlets 22C of the branch pipes 22A is arranged on the central axis AX.

A seal groove 48 in which the seal member 47 is arranged is provided around the channel groove 42 provided in the front surface 40A. The seal groove 48 is provided in the front surface 40A of the channel plate 40. The seal member 47 includes, for example, an O-ring. The seal member 47 is in contact with the heat transfer plate 11, which faces the channel groove 42, in a state of being arranged in the seal groove 48. When the pair of heat transfer plates 11 and the pair of channel plates 40 are fastened by the bolts 60 and the nuts 61, the seal member 47 is pressed by the heat transfer plates 11 and crushed. Thus, the seal member 47 seals a boundary between the front surface 40A of the channel plate 40 and the heat transfer plate 11.

<Spacer Member>

The spacer member 41 is arranged between the pair of channel plates 40. A support surface 41A of the spacer member 41 is in contact with the back surface 40B of the one channel plate 40. For example, the spacer member 41 is arranged in such a manner as to maintain a state in which the back surface 40B of the one channel plate 40 and the back surface 40B of the other channel plate 40 face each other with the space SP interposed therebetween. For example, the spacer member 41 may have the same length as a distance from the back surface 40B of the one channel plate 40 to the back surface 40B of the other channel plate 40. For example, the spacer member 41 may have a length shorter than the distance from the back surface 40B of the one channel plate 40 to the back surface 40B of the other channel plate 40. The spacer member 41 may be provided over an entire circumference along the seal groove 48 in which the seal member 47 is arranged, or may be provided in such a manner as to be placed in a part thereof. A plurality of the spacer members 41 may be provided along the seal groove 48 in which the seal member 47 is arranged.

The spacer member 41 is made of a material different from a material of the channel plates 40. The spacer member 41 is made of a material having higher compressive strength than that of the channel plates 40. The spacer member 41 is made of a material having a creep deformation amount smaller than that of the channel plates 40. The spacer member 41 is made of, for example, a material having higher compressive strength than that made of PTFE, PFA, or PVDF. The spacer member 41 is made of a material having a smaller creep deformation amount than that made of PTFE, PFA, or PVDF, for example. The spacer member 41 is made of, for example, resin such as polyvinyl chloride (PVC), polyether ether ketone (PEEK), poly phenylene sulfide (PPS), polyacetal (POM), polyethylene terephthalate (PET), polypropylene (PP), polycarbonate (PC), acrylonitrile butadiene styrene (ABS) resin, or polyethylene. The spacer member 41 is made of metal such as stainless steel or aluminum, for example.

At least a part of the spacer member 41 is placed in a region immediately below the seal groove 48 in which the seal member 47 is arranged. The spacer member 41 is arranged to include at least a part of the region immediately below the seal groove 48.

Figure 7:
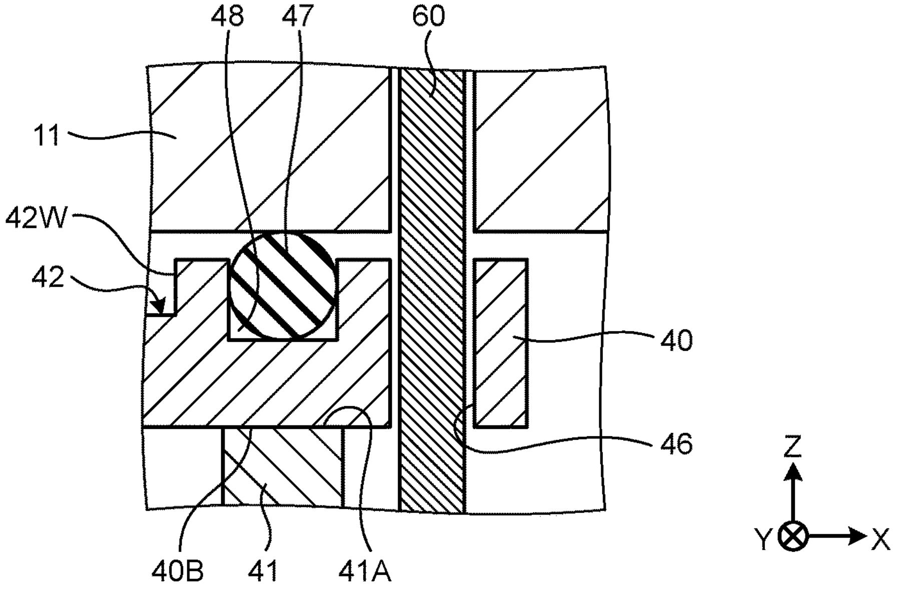
FIG. 7 is a partially-enlarged view of an example of a spacer member according to the first embodiment.

FIG. 7 is a partially-enlarged view of an example of the spacer member 41 according to the first embodiment. In the example illustrated in FIG. 7, the spacer member 41 is formed in a columnar shape. The spacer member 41 has the same width as the seal groove 48. The spacer member 41 is placed in a region having the same cross section as the region immediately below the seal groove 48. The spacer member 41 extends from immediately below the seal groove 48 of the one channel plate 40 to immediately below the seal groove 48 of the other channel plate 40. One end surface of the spacer member 41 is in contact with the region immediately below the seal groove 48 in the back surface 40B of the one channel plate 40. The other end surface of the spacer member 41 is in contact with the region immediately below the seal groove 48 in the back surface 40B of the other channel plate 40.

<Assembling Method>

Figure 8:
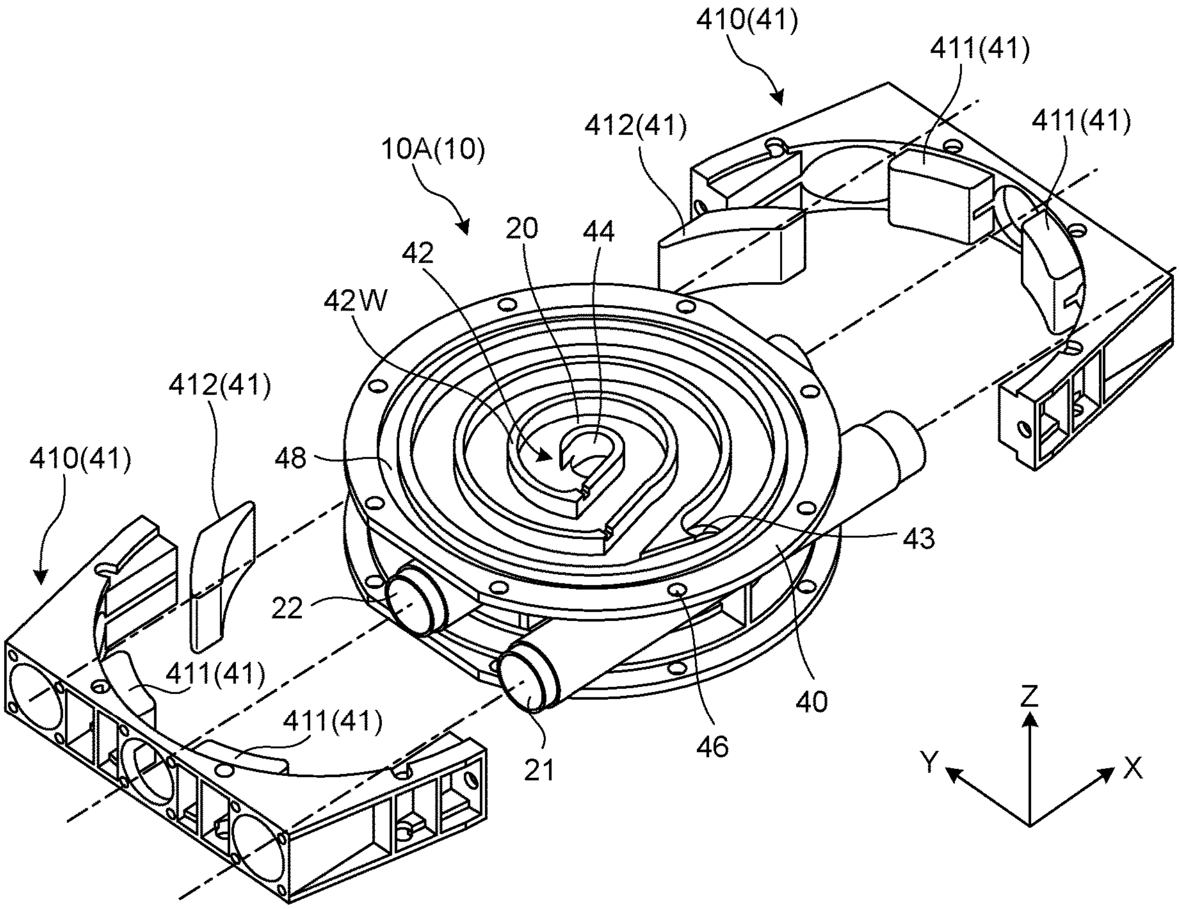
FIG. 8 is a view for describing an assembling method of the main body of the temperature adjustment device according to the first embodiment.

Next, an assembling method of the temperature adjustment device 3 according to the first embodiment will be described with reference to FIG. 8 to FIG. 12. In the embodiment, the main body 10 includes a first main body 10A and a second main body 10B connected to each other. FIG. 8 is a view for describing the assembling method of the first main body 10A of the temperature adjustment device 3 according to the first embodiment. As illustrated in FIG. 8, the spacer member 41 is inserted between the pair of channel plates 40 of the first main body 10A. The spacer member 41 includes a main body 410, a spacer portion 411 formed integrally with the main body 410, and a spacer portion 412 separate from the main body 410. The spacer portion 411 and the spacer portion 412 are inserted in such a manner as to be placed in the region immediately below the seal groove 48. Thus, the pair of channel plates 40 is in contact with the support surfaces 41A of the spacer member 41. The pair of channel plates 40 is supported by the spacer member 41.

Figure 9:
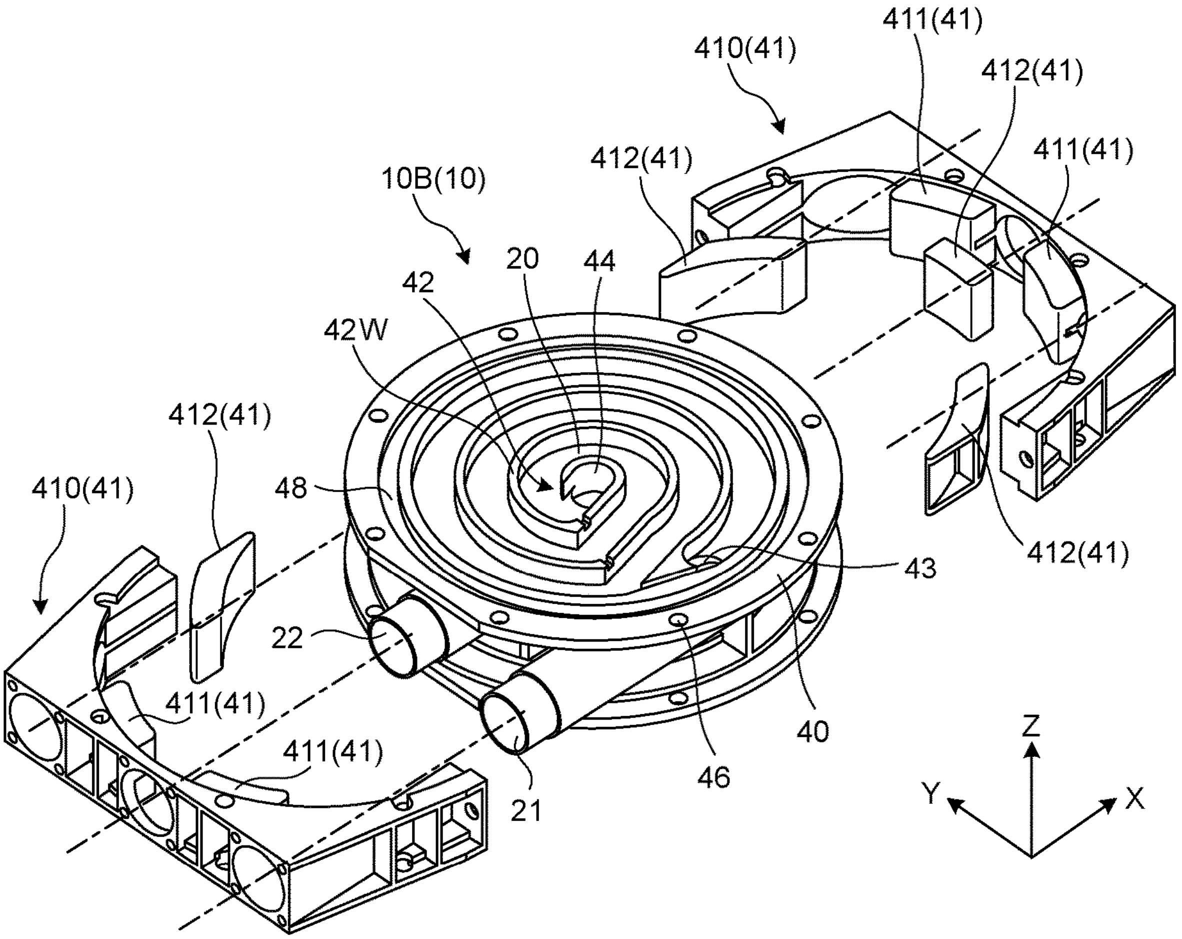
FIG. 9 is a view for describing the assembling method of the main body of the temperature adjustment device according to the first embodiment.

FIG. 9 is a view for describing the assembling method of the second main body 10B of the temperature adjustment device 3 according to the first embodiment. As illustrated in FIG. 9, the spacer member 41 is inserted between the pair of channel plates 40 of the second main body 10B. The spacer member 41 includes a main body 410, a spacer portion 411 formed integrally with the main body 410, and a spacer portion 412 separate from the spacer portion 411. The spacer portion 411 is inserted in such a manner as to be placed in the region immediately below the seal groove 48. Thus, the pair of channel plates 40 is in contact with the support surfaces 41A of the spacer member 41. The pair of channel plates 40 is supported by the spacer member 41.

Figure 10:
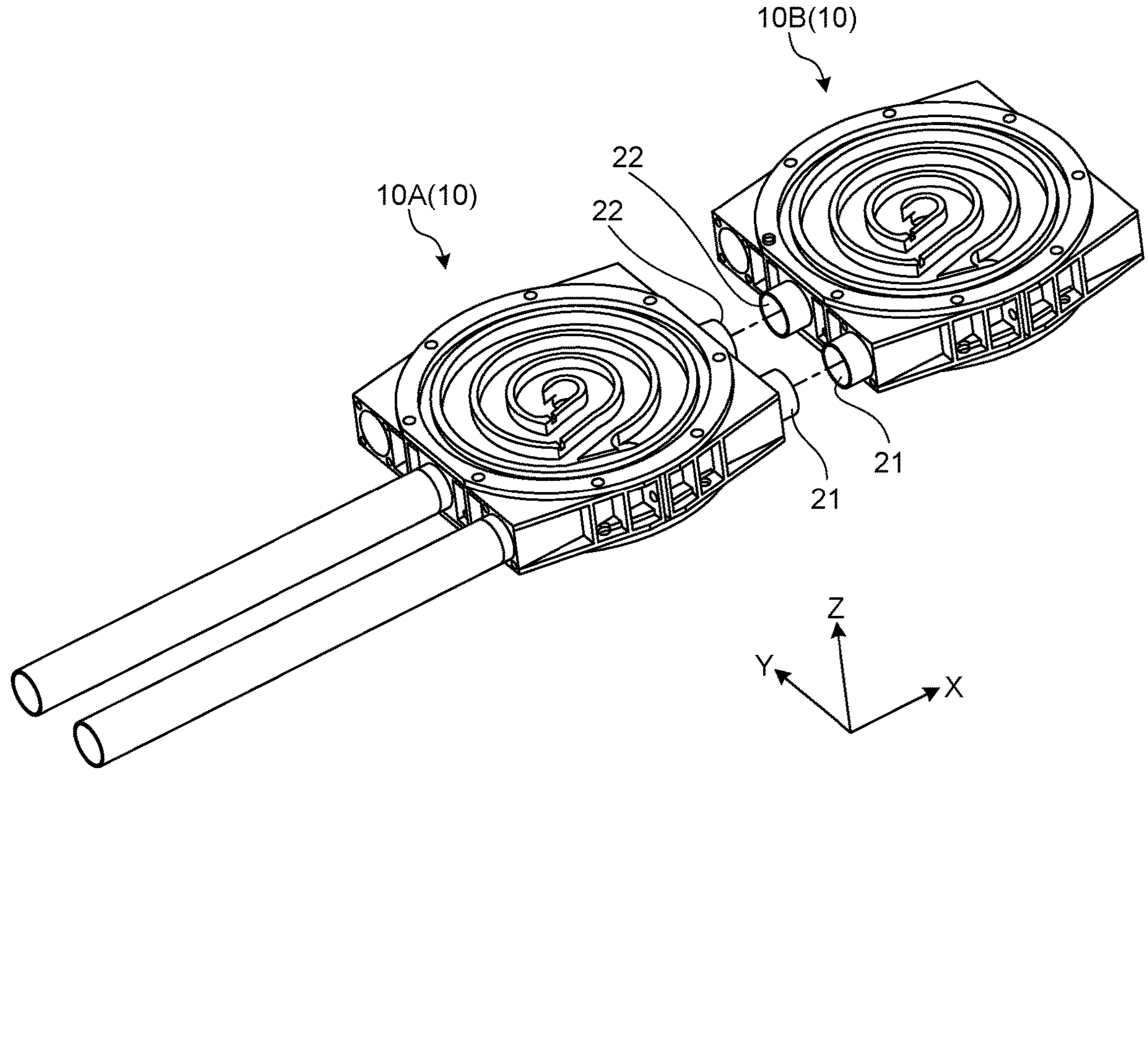
FIG. 10 is a view for describing the assembling method of the main body of the temperature adjustment device according to the first embodiment.

FIG. 10 is a view for describing the assembling method of the main body 10 of the temperature adjustment device 3 according to the first embodiment. As illustrated in FIG. 10, the first main body 10A and the second main body 10B are connected. In the embodiment, the description will be made on the assumption that the first main body 10A is arranged on an upstream side of the flow of the liquid LQ and the second main body 10B is arranged on a downstream side of the flow of the liquid LQ. An end on the downstream side of a supply pipe 21 of the first main body 10A and an end on the upstream side of a supply pipe 21 of the second main body 10B are connected. An end on the upstream side of a discharge pipe 22 of the first main body 10A and an end on the downstream side of a discharge pipe 22 of the second main body 10B are connected.

Figure 11:
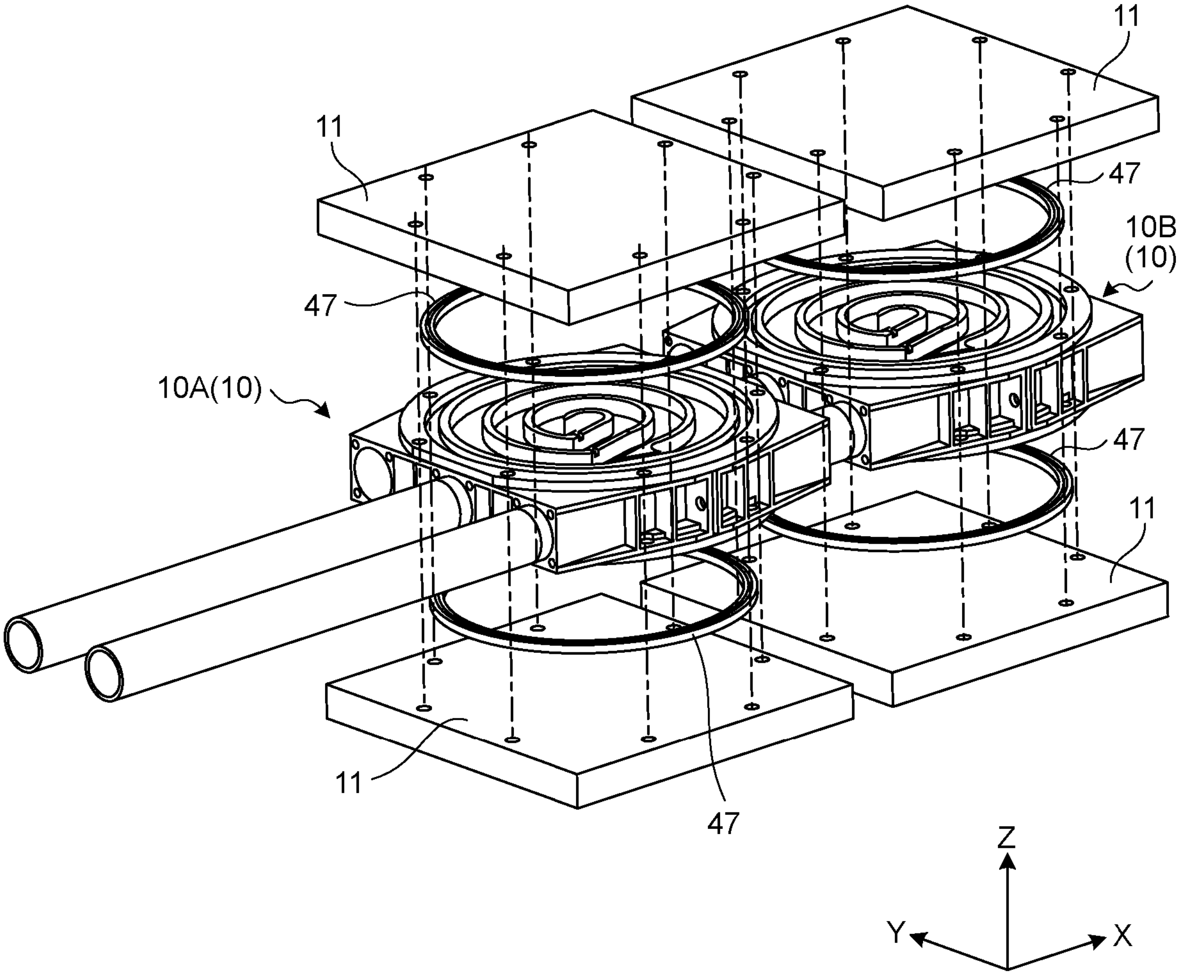
FIG. 11 is a view for describing the assembling method of the main body of the temperature adjustment device according to the first embodiment.

FIG. 11 is a view for describing the assembling method of the main body 10 of the temperature adjustment device 3 according to the first embodiment. As illustrated in FIG. 11, the seal members 47 are arranged in the seal grooves 48 respectively provided in the front surfaces 40A of the channel plates 40. The heat transfer plates 11 are arranged in such a manner as to cover the connected first main body 10A and second main body 10B. Each of the heat transfer plates 11 is arranged in such a manner as to cover the channel groove 42. In addition, the heat transfer plate 11 is in contact with the seal member 47. As a result, the channel 20 is formed between the heat transfer plate 11 and the channel plate 40.

Figure 12:
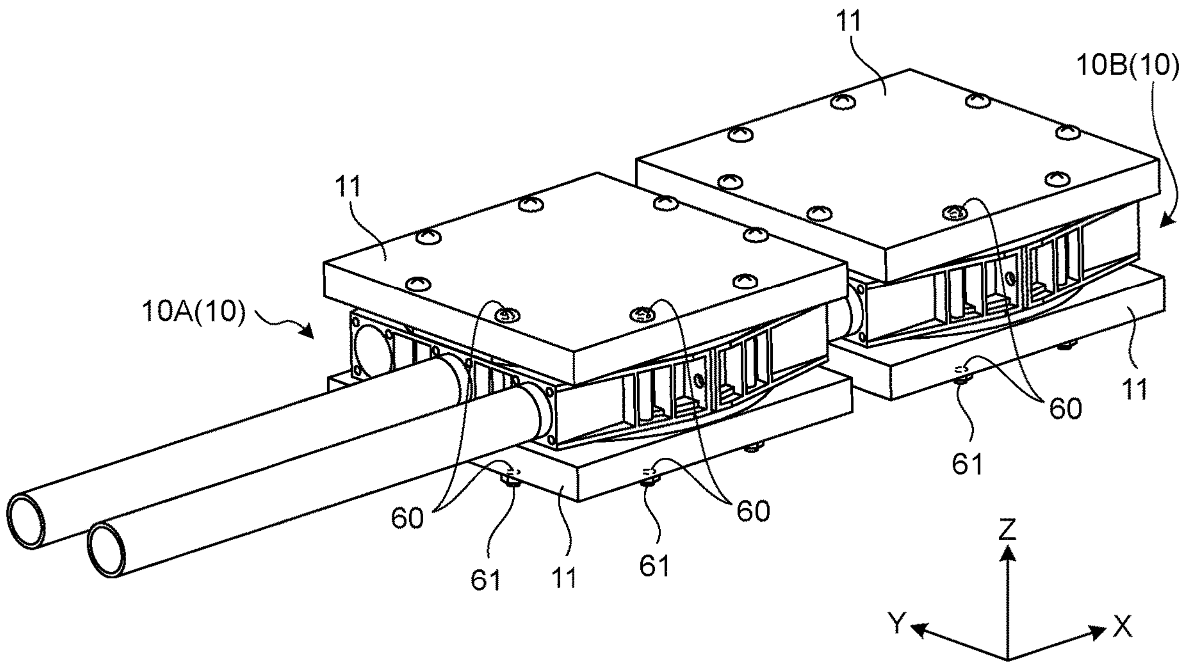
FIG. 12 is a view for describing the assembling method of the temperature adjustment device according to the first embodiment.

FIG. 12 is a view for describing the assembling method of the temperature adjustment device 3 according to the first embodiment. As illustrated in FIG. 12, the pair of heat transfer plates 11 and the pair of channel plates 40 are fixed by the bolts 60 and the nuts 61.

<Operation>

Next, an operation of the temperature adjustment device 3 according to the first embodiment will be described. The liquid LQ is supplied to the channel groove 42, which is the channel 20, via the supply pipe 21 and the fluid supply port 43. The liquid LQ is guided by the channel groove 42 and flows toward the fluid discharge port 44. In the embodiment, the channel groove 42 has a spiral shape. The liquid LQ supplied from the fluid supply port 43 to the channel groove 42 is discharged from the fluid discharge port 44 after flowing in directions respectively indicated by an arrow a, an arrow b, an arrow c, an arrow d, an arrow e, an arrow f, and an arrow g illustrated in FIG. 5.

When a potential difference is applied to the thermoelectric modules 30, the temperature adjustment device 3 starts adjustment of the temperature of liquid LQ flowing through the channel groove 42. The temperature of the liquid LQ flowing through the channel groove 42 is adjusted by heat absorption or heat generation by the thermoelectric modules 30.

The seal member 47 seals a boundary between the front surface 40A and the heat transfer plate 11 outside the channel groove 42. Thus, the liquid LQ is prevented from leaking from the main body 10.

The liquid LQ flowing through the channel groove 42 is discharged through the fluid discharge port 44. In the embodiment, at least a part of the fluid discharge port 44 is arranged on the central axis AX of the channel plate 40. At least a part of the inlet 22C of the discharge pipe 22 is also arranged on the central axis AX. That is, in the XY plane, a position of the fluid discharge port 44 provided in the channel plate 40 coincides with a position of the inlet 22C provided in the discharge pipe 22. Thus, generation of stagnation of when the liquid LQ is discharged from the channel groove 42 to the discharge pipe 22 is controlled.

<Action>

Next, the action of the spacer member 41 according to the embodiment will be described. Between the pair of channel plates 40, the spacer member 41 is arranged in at least a part of the region immediately below the seal groove 48. The pair of heat transfer plates 11 is supported by the support surfaces 41A of the spacer member 41. As a result, in a case where a load acts on the pair of heat transfer plates 11, the spacer member 41 receives the load. The compressive strength of the spacer member 41 in the Z-axis direction is higher than the compressive strength of the channel plates 40. In addition, the creep deformation amount of the spacer member 41 in the Z-axis direction is smaller than the creep deformation amount of the channel plates 40. Even when the load acts on the pair of heat transfer plates 11, the creep deformation of the spacer member 41 is controlled. Thus, deformation of the channel plates 40 in the region immediately below the seal groove 48 in which the seal member 47 is arranged is controlled. As a result, a deformation amount of the seal groove 48 and a crushed amount of the seal member 47 are maintained at constant amounts. Thus, sealing performance of the seal member 47 is maintained. Thus, leakage of the liquid LQ, which flows through the channel groove 42, from the main body 10 is controlled.

<Effect>

As described above, in the embodiment, the spacer member 41 is arranged in at least a part of the region immediately below the seal groove 48 between the pair of channel plates 40. The compressive strength of the spacer member 41 in the Z-axis direction is higher than the compressive strength of the channel plates 40. In addition, in the embodiment, the creep deformation amount of the spacer member 41 in the Z-axis direction is smaller than the creep deformation amount of the channel plates 40. Even when the load acts on the pair of heat transfer plates 11, the creep deformation of the spacer member 41 can be controlled. Thus, deformation of the channel plates 40 in the region immediately below seal groove 48 in which the seal member 47 is arranged can be controlled in the embodiment. As a result, in the embodiment, the crushed amount of the seal member 47 can be maintained at a constant amount. According to the embodiment, deformation due to a time-dependent load can be controlled. According to the embodiment, the seal performance of the seal member 47 can be maintained. Thus, in the embodiment, the leakage of the liquid LQ, which flows through the channel groove 42, from the main body 10 can be appropriately controlled over a long period of time.

Figure 19:
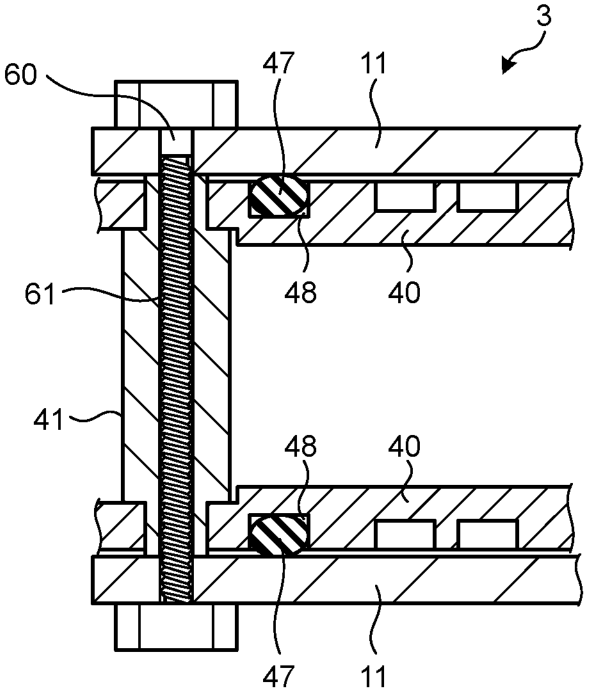
FIG. 19 is a cross-sectional view illustrating an example of a main body of a conventional temperature adjustment device.

FIG. 19 is a cross-sectional view illustrating an example of a main body of a conventional temperature adjustment device. In the example illustrated in FIG. 19, a spacer member 41 is arranged in a manner of surrounding a nut 61. The spacer member 41 is placed outside a region immediately below a seal groove 48. The spacer member 41 is not placed outside the region immediately below the seal groove 48.

In the embodiment, the corrosion-resistant plate 11P has corrosion resistance to the acid liquid LQ. According to the embodiment, corrosion is controlled even when the acid liquid LQ is in contact, cleanliness of the cleaning system 1 can be maintained.

In the embodiment, the spacer member 41 has a cross-sectional area of the same size as a cross-sectional area of the region immediately below the seal groove 48 in which the seal member 47 is arranged. In the embodiment, deformation of the channel plates 40 in the region immediately below the seal groove 48 can be appropriately controlled.

In the embodiment, the spacer member 41 is made of resin or metal. In the embodiment, the creep deformation amount of the spacer member 41 due to the load acting on the pair of heat transfer plates 11 can be controlled by the creep deformation amount of the channel plates 40.

In the embodiment, a plurality of the spacer members 41 is provided along the seal groove 48 in which the seal member 47 is arranged. According to the embodiment, deformation of the channel plates 40 in the region immediately below the seal groove 48 can be more appropriately controlled.

Modification Example

Figure 13:
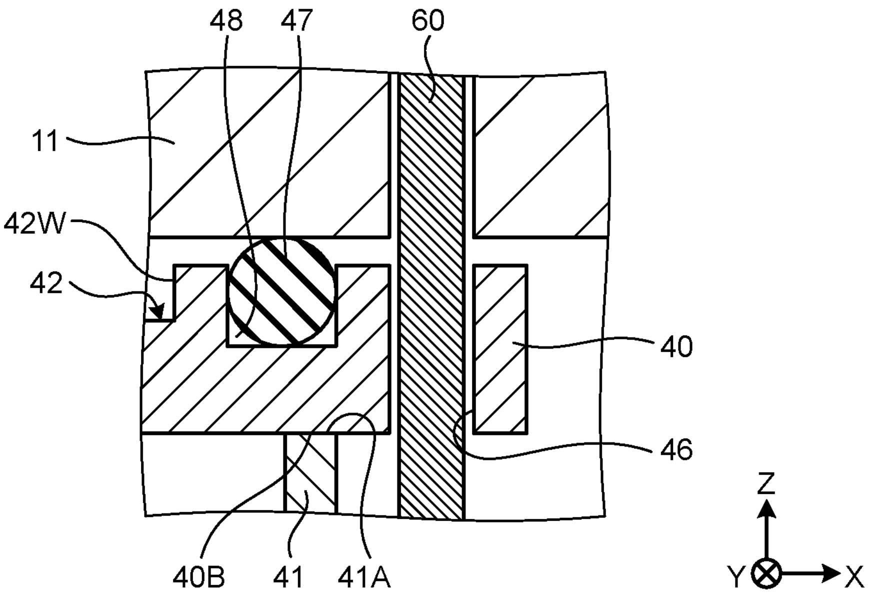
FIG. 13 is a partially-enlarged view of a modification example of the spacer member according to the first embodiment.

A modification example of the columnar spacer member 41 will be described with reference to FIG. 13 and FIG. 14. FIG. 13 is a partially-enlarged view of a modification example of the spacer member 41 according to the first embodiment. In the example illustrated in FIG. 13, the spacer member 41 is formed in a columnar shape having a narrower width than a seal groove 48. The spacer member 41 is arranged to include a part of a region immediately below the seal groove 48. The spacer member 41 is placed in a region having a cross section narrower than the region immediately below the seal groove 48. Although the spacer member 41 is arranged closer to the outside of the region immediately below the seal groove 48 in the example illustrated in FIG. 13, this is not a limitation. The spacer member 41 may be arranged closer to an inner side of the region immediately below the seal groove 48, or may be arranged in a middle portion. With such a configuration, the spacer member 41 can be downsized.

Figure 14:
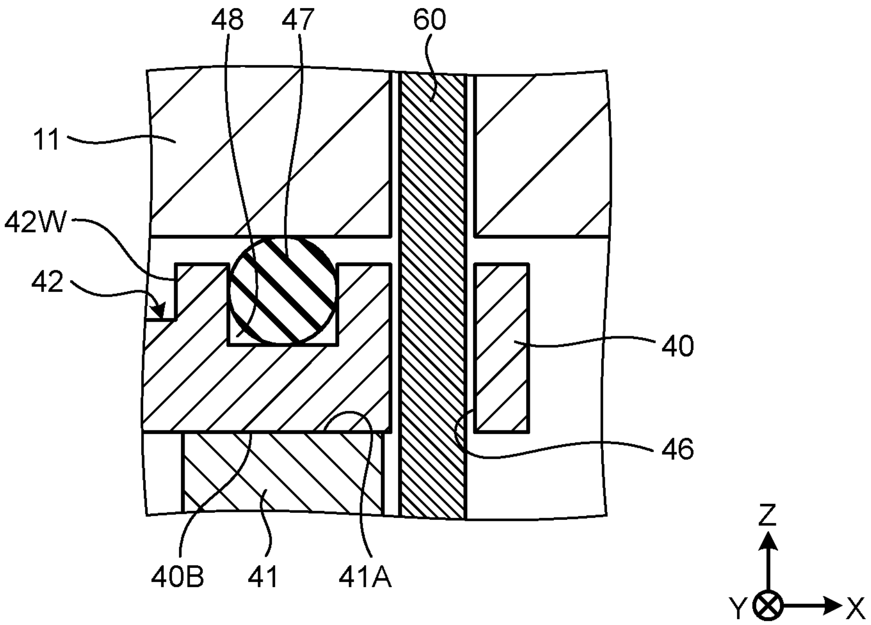
FIG. 14 is a partially-enlarged view of the modification example of the spacer member according to the first embodiment.

FIG. 14 is a partially-enlarged view of a modification example of the spacer member 41 according to the first embodiment. In the example illustrated in FIG. 14, the spacer member 41 is formed in a columnar shape having a wider width than a seal groove 48. The spacer member 41 is arranged to include a whole of a region immediately below the seal groove 48. The spacer member 41 is placed in a region having a cross section wider than the region immediately below the seal groove 48. With such a configuration, it is possible to further control deformation of a channel plate 40 in the region immediately below the seal groove 48 in which a seal member 47 is arranged.

Figure 15:
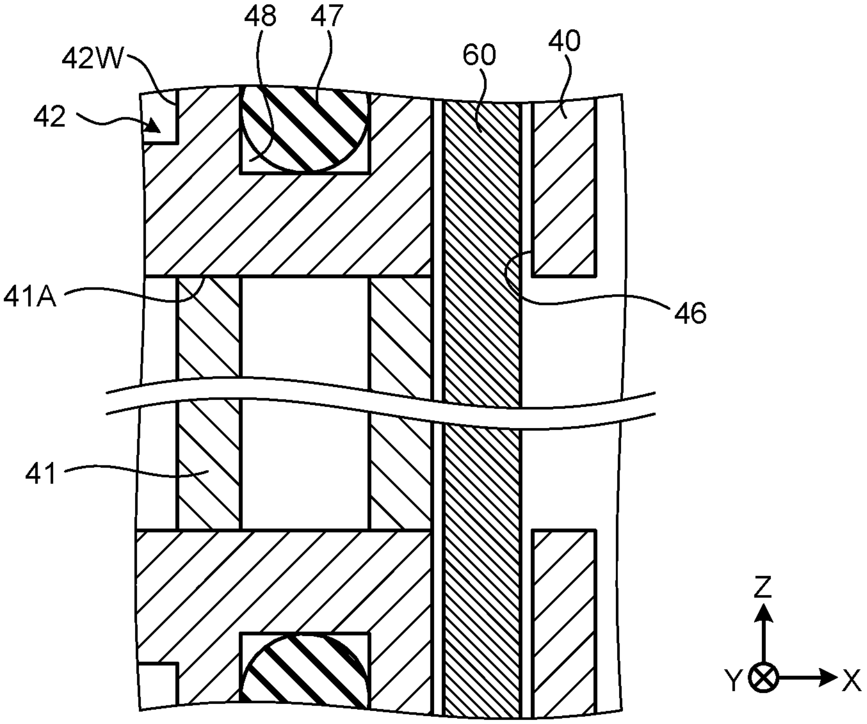
FIG. 15 is a partially-enlarged view of the modification example of the spacer member according to the first embodiment.

Modification examples of the spacer member 41 other than the columnar shape will be described with reference to FIG. 15 to FIG. 18. FIG. 15 is a partially-enlarged view of a modification example of the spacer member 41 according to the first embodiment. In the example illustrated in FIG. 15, a spacer member 41 has a tubular shape on an XZ plane. With such a configuration, weight of the spacer member 41 can be reduced.

Figure 16:
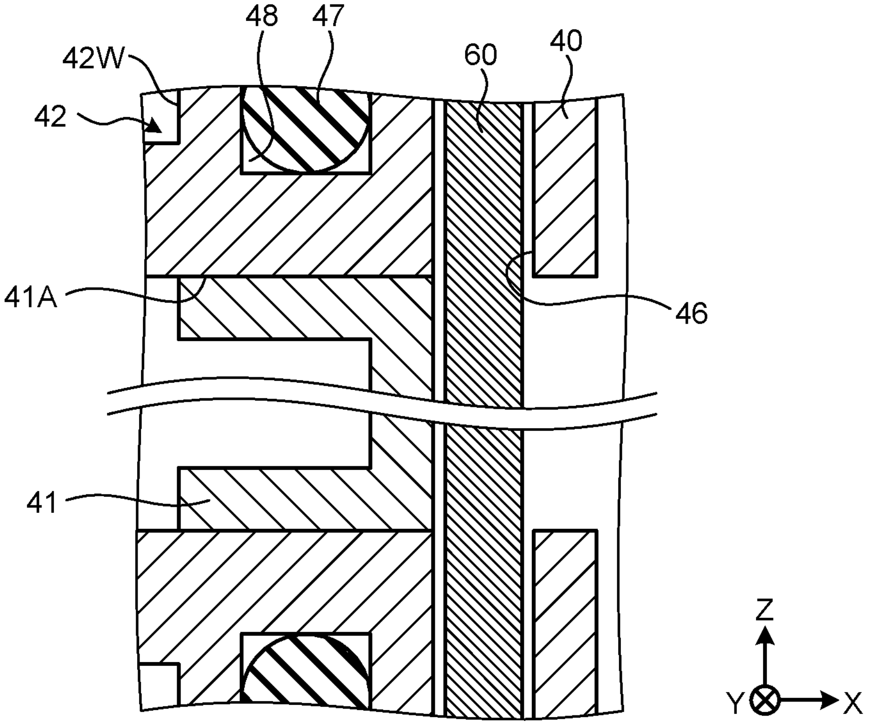
FIG. 16 is a partially-enlarged view of the modification example of the spacer member according to the first embodiment.

FIG. 16 is a partially-enlarged view of a modification example of the spacer member 41 according to the first embodiment. In the example illustrated in FIG. 16, a spacer member 41 has a U-shaped cross-sectional shape opened inward on an XZ plane. With such a configuration, weight of the spacer member 41 can be reduced.

Figure 17:
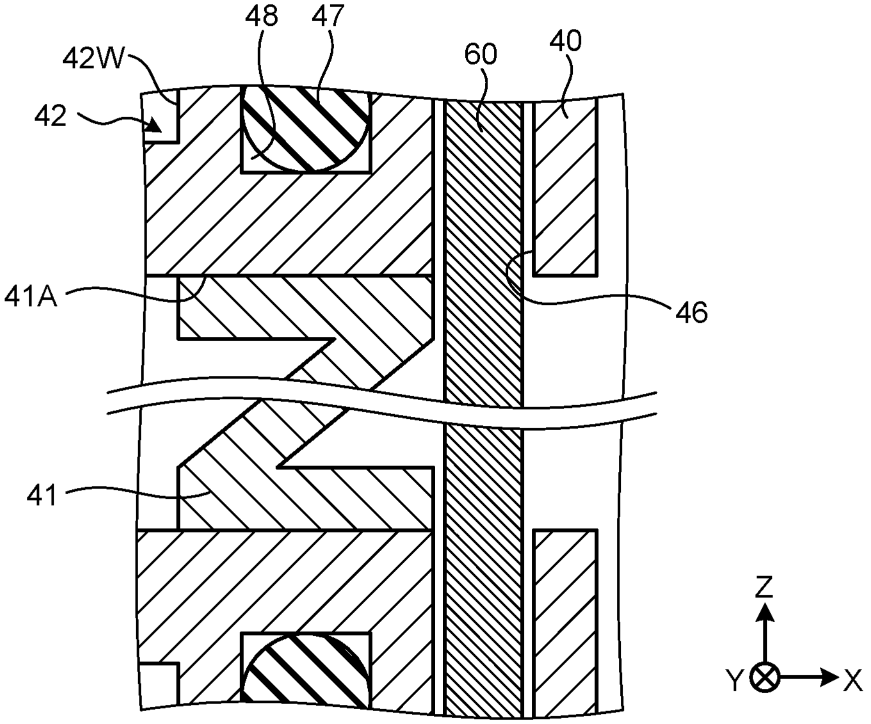
FIG. 17 is a partially-enlarged view of the modification example of the spacer member according to the first embodiment.

FIG. 17 is a partially-enlarged view of a modification example of the spacer member 41 according to the first embodiment. In the example illustrated in FIG. 17, a spacer member 41 has a Z-shaped cross-sectional shape on an XZ plane. With such a configuration, weight of the spacer member 41 can be reduced.

Figure 18:
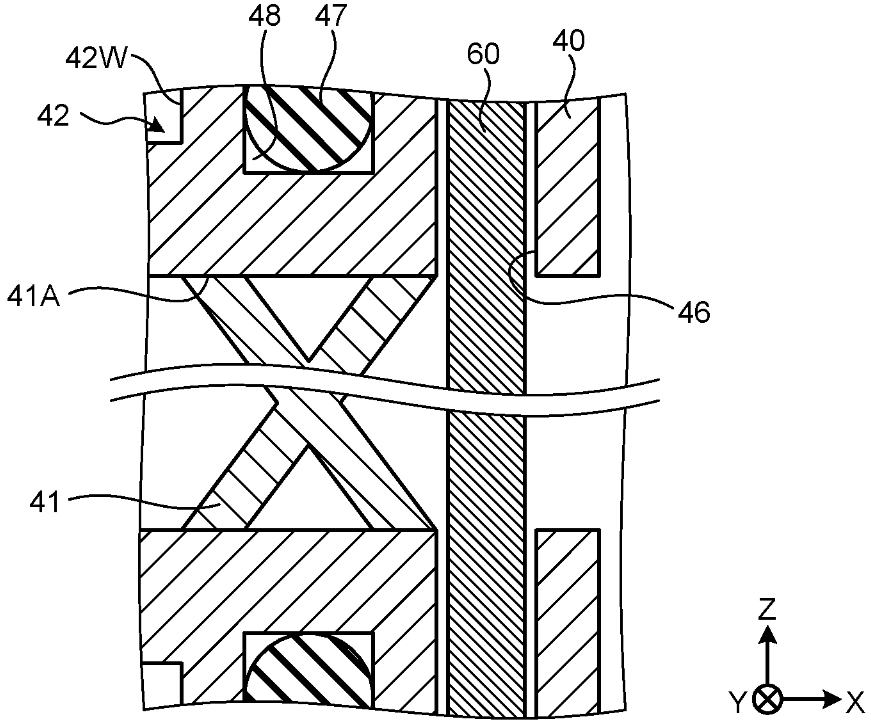
FIG. 18 is a partially-enlarged view of the modification example of the spacer member according to the first embodiment.

FIG. 18 is a partially-enlarged view of a modification example of the spacer member 41 according to the first embodiment. In the example illustrated in FIG. 18, a spacer member 41 has a X-shaped cross-sectional shape on an XZ plane. With such a configuration, weight of the spacer member 41 can be reduced.

Second Embodiment

Figure 20:
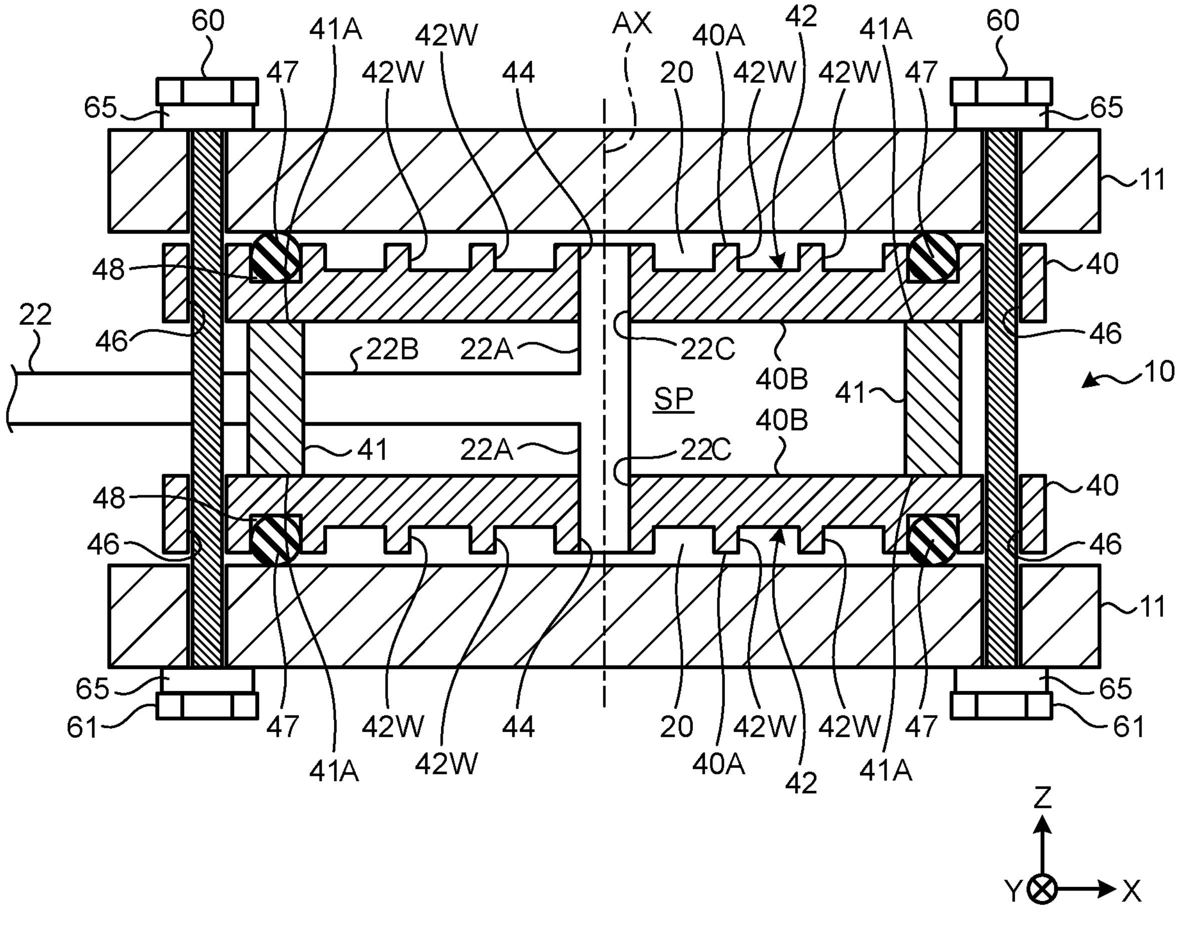
FIG. 20 is a cross-sectional view illustrating an example of a main body of a temperature adjustment device according to a second embodiment.

The second embodiment will be described with reference to FIG. 20. FIG. 20 is a cross-sectional view illustrating an example of a main body of a temperature adjustment device according to the second embodiment. The second embodiment further includes a spring member 65 that regulates loosening of a fastening member in the first embodiment. The spring member 65 is arranged between a head portion of a bolt 60 or a nut 61 and a heat transfer plate 11. The spring member 65 regulates loosening of the bolt 60 and the nut 61. The spring member 65 biases a pair of the heat transfer plates 11 in a direction in which an interval between the pair of heat transfer plates 11 is shortened. The spring member 65 is, for example, a compression spring or a disc spring.

<Effect>

As described above, in the embodiment, the pair of heat transfer plates 11 is biased by the spring member 65 in a direction in which the interval between the pair of heat transfer plates 11 is shortened. In the embodiment, sealing performance of a seal member 47 can be maintained even when deformation is generated due to a time-dependent load. Thus, in the embodiment, leakage of liquid LQ, which flows through a channel groove 42, from a main body 10 can be appropriately controlled over a long period of time.

Third Embodiment

Figure 21:
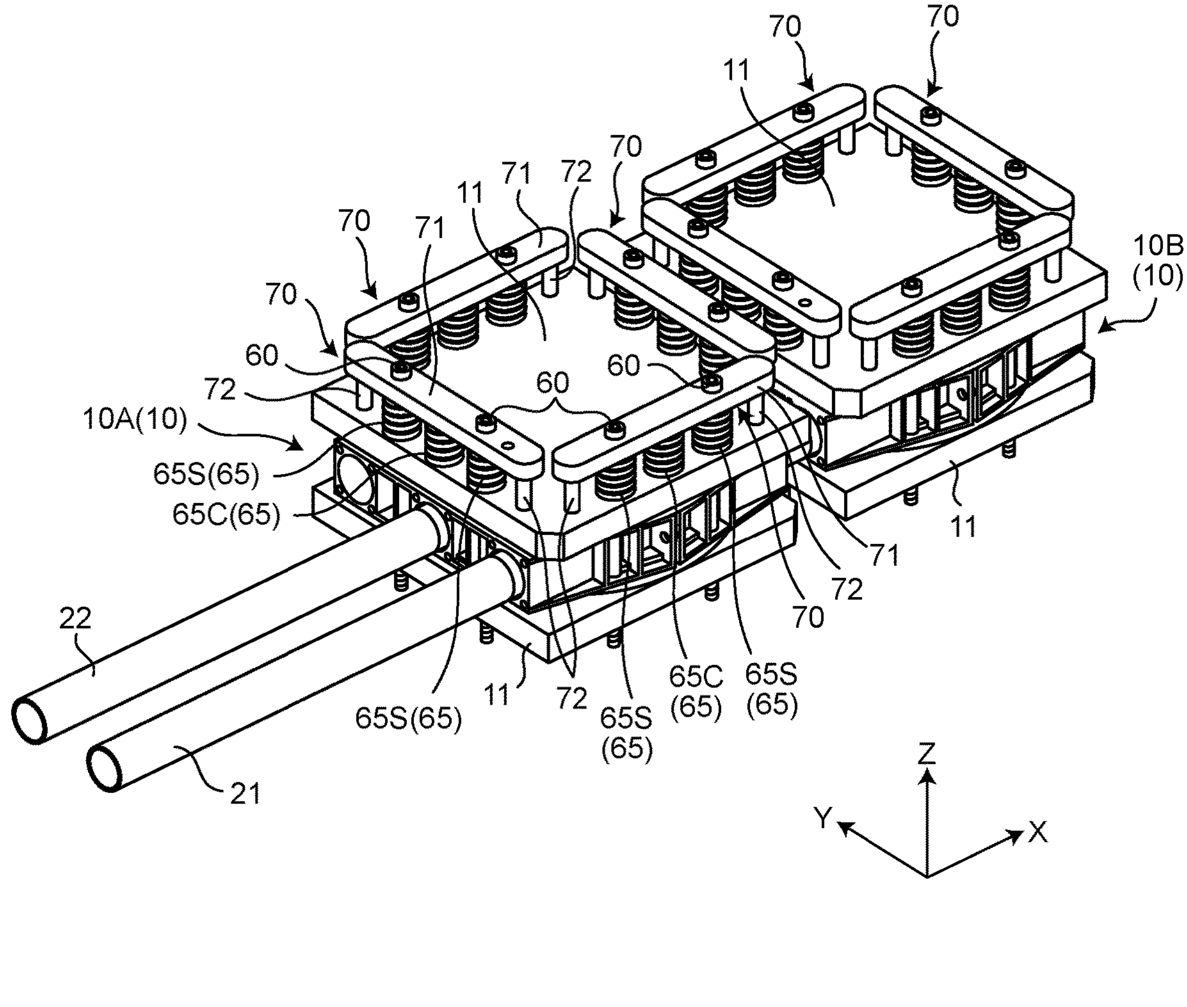
FIG. 21 is a perspective view illustrating an example of a temperature adjustment device according to a third embodiment.
Figure 22:
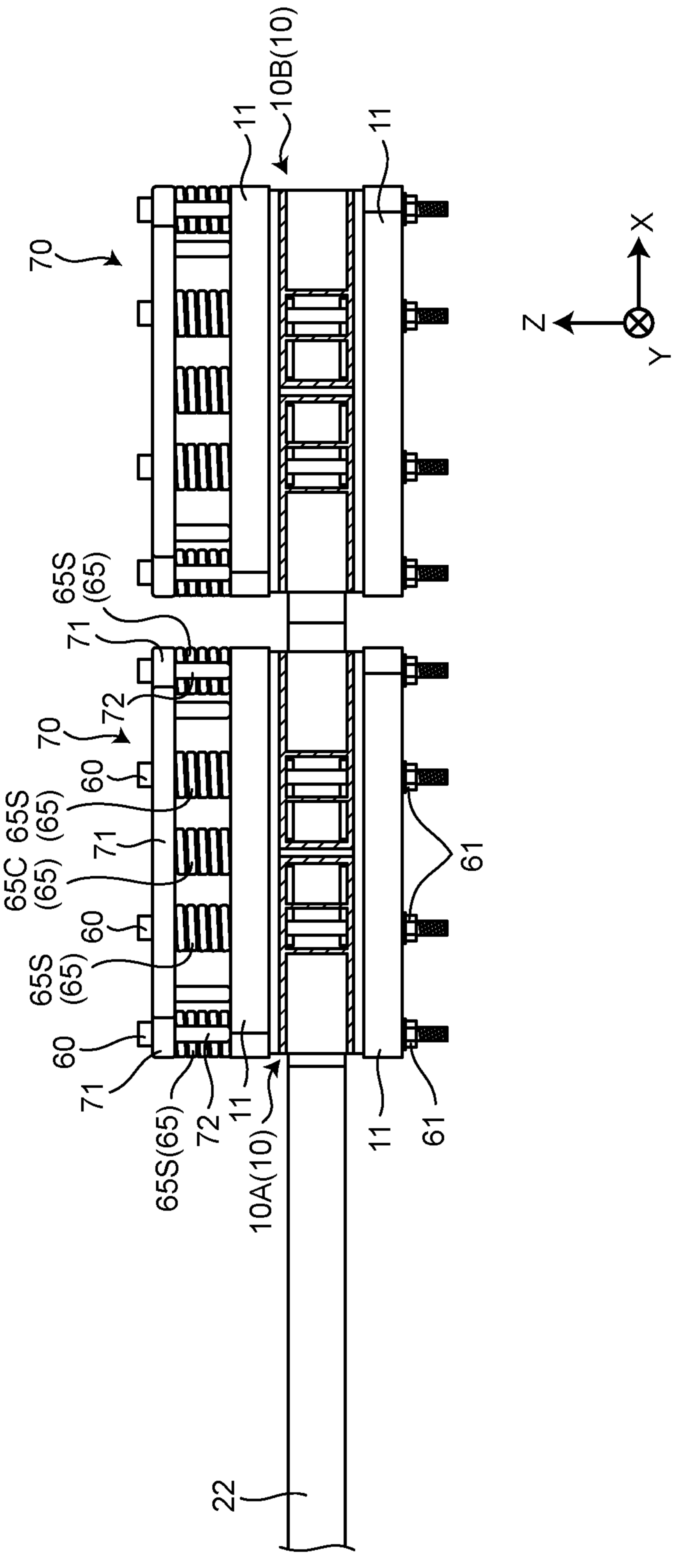
FIG. 22 is a side view illustrating an example of the temperature adjustment device according to the third embodiment.
Figure 23:
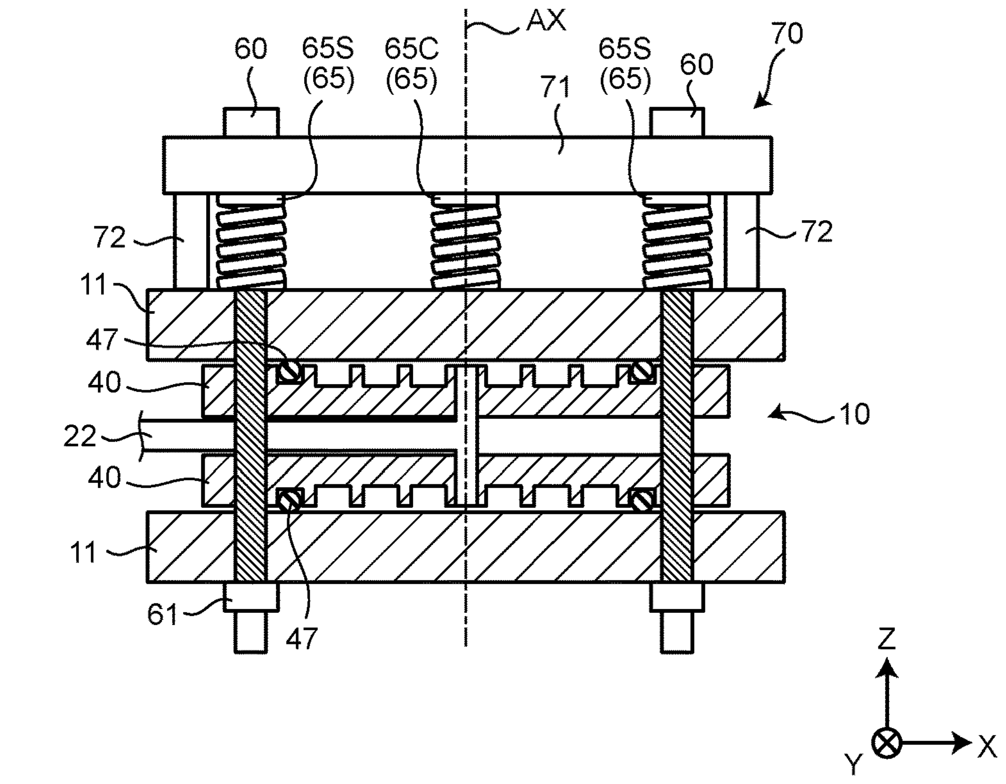
FIG. 23 is a schematic cross-sectional view illustrating an example of a main body of the temperature adjustment device according to the third embodiment.

The second embodiment will be described with reference to FIG. 21 to FIG. 23. FIG. 21 is a perspective view illustrating an example of a temperature adjustment device according to the third embodiment. FIG. 22 is a schematic side view illustrating the example of the temperature adjustment device according to the third embodiment. FIG. 23 is a schematic cross-sectional view illustrating an example of a main body of the temperature adjustment device according to the third embodiment. FIG. 23 is a view in which a regulation member 70 is simplified for the sake of description, and is different from an enlarged view of FIG. 22. The same applies to FIG. 24 and FIG. 25 described later. The third embodiment further includes the regulation member 70 in the first embodiment or the second embodiment.

The regulation member 70 is arranged on an opposite side of a channel plate 40 with respect to a heat transfer plate 11, and regulates an increase in an interval between a pair of the heat transfer plates 11. The regulation member 70 is made of metal such as stainless steel or aluminum, for example. The regulation member 70 is arranged on an outer side of a seal member 47. In the embodiment, four regulation members 70 are arranged in a manner of corresponding to four sides of the rectangular heat transfer plate 11 as viewed in a Z-axis direction. The four regulation members 70 are similarly configured. Each of the regulation members 70 includes a base portion 71 arranged in a manner of facing the heat transfer plate 11 with a space therebetween, and a pair of leg portions 72 extending from the base portion 71 toward the heat transfer plate 11.

The base portion 71 has a rod shape extending along the one side of the rectangular heat transfer plate 11 as viewed in the Z-axis direction. In the embodiment, a length of the base portion 71 in a longitudinal direction is longer than a half of the one side of the heat transfer plate 11 and shorter than the length of the one side.

In the embodiment, the leg portions 72 extend in the Z-axis direction. A length of the leg portions 72 in the Z-axis direction is a length in which an increase in the interval between the pair of heat transfer plates 11 is permitted within a range in which a sealing effect by the sealing member 47 is not reduced. Tip portions 72 of the leg portions 72 abut on a surface 11 of the heat transfer plate 11 when the heat transfer plate 40 undergoes creep deformation.

A spring member 65 expands and contracts in a direction in which the pair of channel plates 40 and the pair of heat transfer plates 11 overlap each other. The spring member 65 expands and contracts between the base portion 71 and the heat transfer plate 11 facing each other.

A bolt 60 and a nut 61, which are fastening members, fasten the base portion 71 of the regulation member 70 together with the pair of channel plates 11 and the pair of heat transfer plates 40. In the embodiment, the bolt 60 and the nut 61 that are the fastening members are arranged on a center side compared to the leg portions 72 as viewed in the Z-axis direction. In the embodiment, one regulation member 70 is fastened at both ends in the longitudinal direction of the base portion 71 by the fastening members.

One or more spring members 65 are arranged with respect to the one regulation member 70. In the embodiment, three spring members 65 are arranged with respect to the one regulation member 70. The number of the spring members 65 is not limited. The spring members 65 arranged in a manner of corresponding to the one regulation member 70 are arranged apart in the longitudinal direction of the regulation member 70. The spring members 65 are arranged between the base portion 71 of the regulation member 70 and the heat transfer plate 11 arranged in a manner of facing the base portion 71.

In the embodiment, the bolt 60 is inserted into each of spring members 65S arranged at both ends among the spring members 65 arranged in a manner of corresponding to the one regulation member 70. In other words, each of the spring members 65S arranged at the both ends is arranged coaxially with the bolt 60 in such a manner as to surround an outer periphery of the bolt 60. In the embodiment, the bolt 60 is not inserted into a spring member 65C arranged at a center among the spring members 65 arranged in a manner of corresponding to the one regulation member 70. In other words, the spring member 65C arranged at the center is arranged at a position shifted from the bolt 60 as viewed in the Z-axis direction. Note that the spring member 65C arranged at the center is positioned by a pin (not illustrated) shorter than the leg portions 72 formed in the base portion 71.

<Effect>

As described above, in the embodiment, even in a case where a pressure caused by liquid LQ flowing through a channel groove 42 increases, it is possible to regulate the increase in the interval between the pair of heat transfer plates 11 by the regulation member 70. In the embodiment, leakage of the liquid LQ, which flows through the channel groove 42, from a main body 10 can be appropriately controlled over a long period of time.

Modification Example

Figure 24:
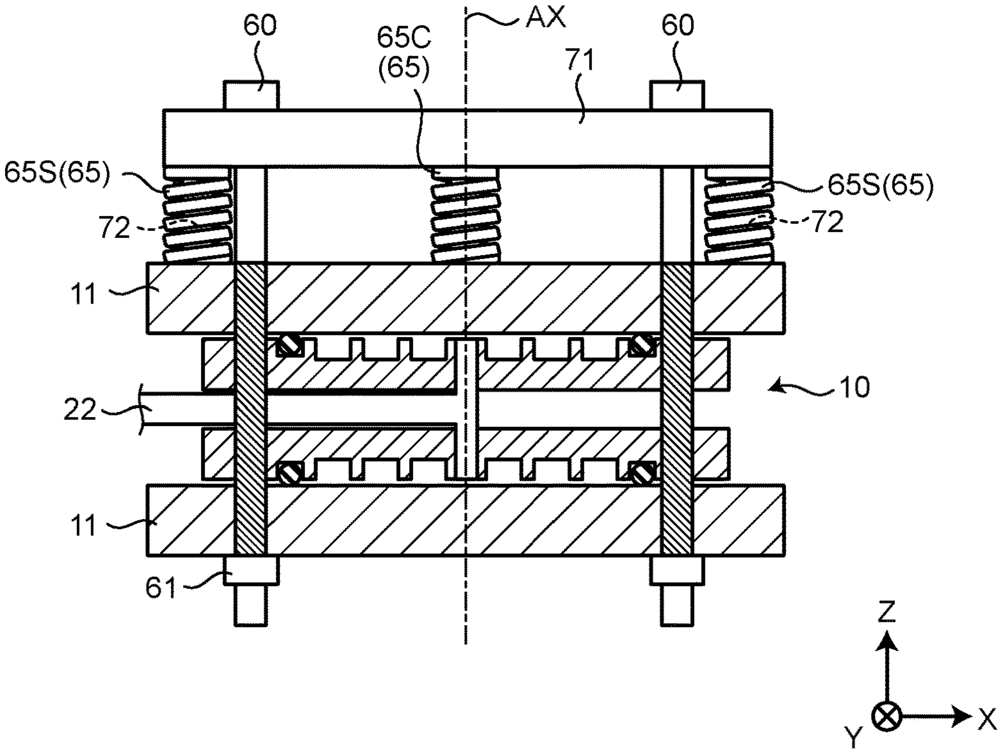
FIG. 24 is a schematic cross-sectional view illustrating a modification example of the main body of the temperature adjustment device according to the third embodiment.

FIG. 24 is a cross-sectional view illustrating a modification example of the main body of the temperature adjustment device according to the third embodiment. In the example illustrated in FIG. 24, bolts 60 are not inserted into all spring members 65. In other words, all the spring members 65 are arranged at positions shifted from the bolts 60 as viewed in a Z-axis direction.

In the embodiment, a leg portion 72 of a regulation member 70 is inserted into each of spring members 65S arranged at both ends among the spring members 65 arranged in a manner of corresponding to one regulation member 70. In other words, each of the spring members 65S arranged at the both ends is arranged coaxially with the leg portion 72 of the regulation member 70 in such a manner as to surround an outer periphery of the leg portion 72 of the regulation member 70. In the embodiment, the leg portion 72 of the regulation member 70 is not inserted into a spring member 65C arranged at a center among the spring members 65 arranged in a manner of corresponding to the one regulation member 70. In other words, the spring member 65C arranged at the center is arranged at a position shifted from the leg portion 72 of the regulation member 70 as viewed in the Z-axis direction. Note that the spring member 65C arranged at the center is positioned by a pin (not illustrated) shorter than the leg portions 72 formed in a base portion 71.

Figure 25:
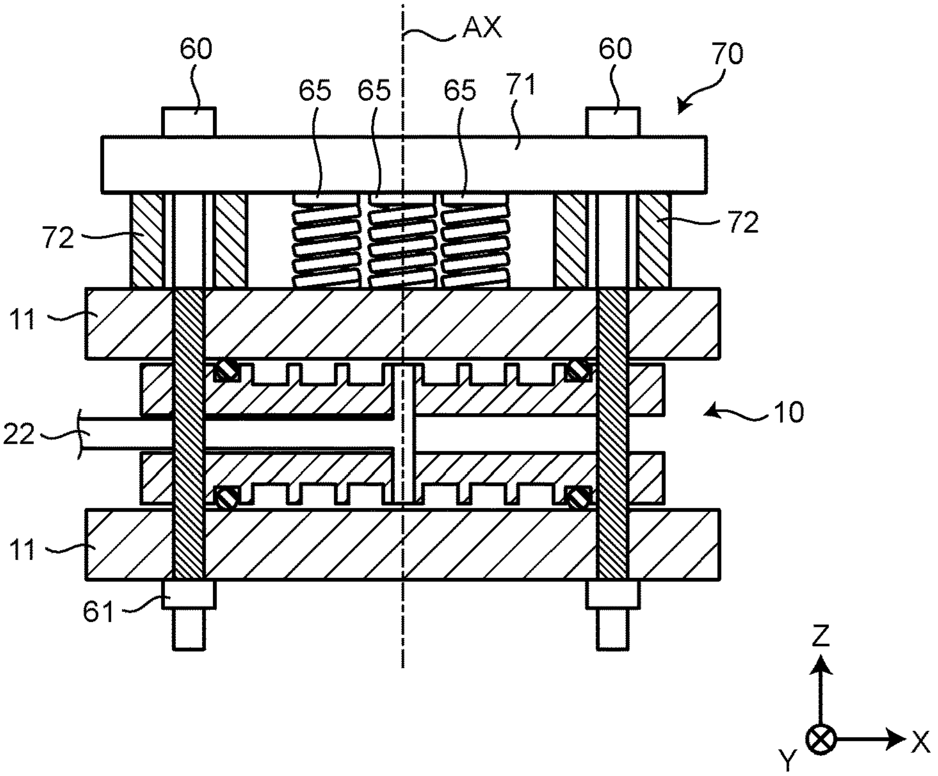
FIG. 25 is a schematic cross-sectional view illustrating the modification example of the main body of the temperature adjustment device according to the third embodiment.

FIG. 25 is a cross-sectional view illustrating a modification example of the main body of the temperature adjustment device according to the third embodiment. In the example illustrated in FIG. 25, a leg portion 72 is formed in a tubular shape surrounding a bolt 60. The bolt 60 is inserted into a hollow portion of the leg portion 72.

All spring members 65 are arranged between a pair of the leg portions 72 of a regulation member 70. In all the spring members 65, the bolts 60 and the leg portions 72 are not inserted. In other words, all the spring members 65 are arranged at positions shifted from the bolts 60 as viewed in a Z-axis direction. Note that all the spring members 65 are positioned by pins (not illustrated) shorter than the leg portions 72 formed in a base portion 71.

Figure 26:
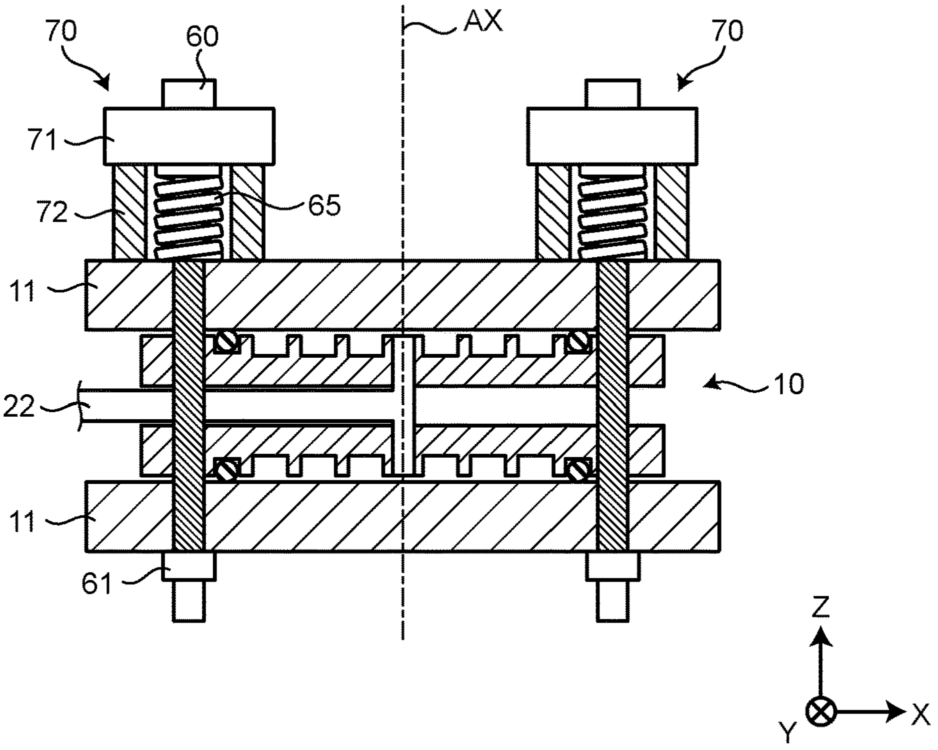
FIG. 26 is a schematic cross-sectional view illustrating the modification example of the main body of the temperature adjustment device according to the third embodiment.

FIG. 26 is a cross-sectional view illustrating a modification example of the main body of the temperature adjustment device according to the third embodiment. In the example illustrated in FIG. 26, one regulation member 70 and one spring member 65 are arranged for each bolt 60. The regulation member 70 is fastened by one fastening member. The regulation member 70 includes a base portion 71 and a tubular leg portion 72 surrounding the bolt 60. The bolt 60 is inserted into the hollow portion of the leg portion 72. In the example illustrated in FIG. 26, a length of the base portion 71 in an X-axis direction is shorter than a half of one side of a heat transfer plate 11 and longer than a width of the spring member 65 in the X-axis direction.

The spring member 65 is accommodated in the hollow portion of the leg portion 72. The bolt 60 is inserted into the spring member 65.

Figure 27:
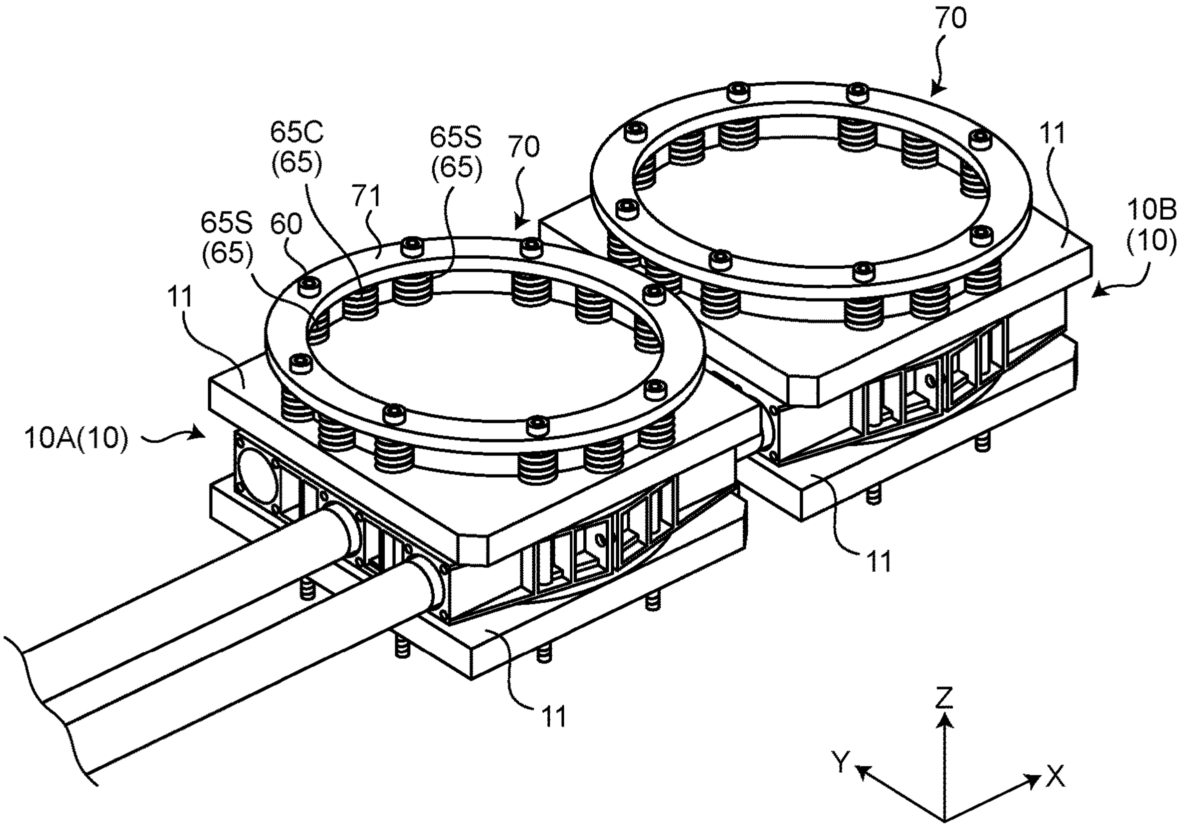
FIG. 27 is a perspective view illustrating the modification example of the temperature adjustment device according to the third embodiment.

FIG. 27 is a perspective view illustrating a modification example of the temperature adjustment device according to the third embodiment. In the example illustrated in FIG. 27, a base portion 71 of a regulation member 70 is formed in an annular shape. The base portion 71 of the regulation member

70 is arranged on an outer peripheral side compared to a seal member 47 (not illustrated) as viewed in a Z-axis direction. The base portion 71 of the regulation member 70 is fastened together with a pair of channel plates 11 and a pair of heat transfer plates 40 by bolts 60 and nuts 61 that are fastening members and arranged at intervals in a circumferential direction of the base portion 71 of the regulation member 70.

Spring members 65 are arranged at intervals in the circumferential direction of the base portion 71 of the regulation member 70. In the embodiment, a spring member 65S into which the bolt 60 is inserted and a spring member 65C into which the bolt 60 is not inserted are arranged. The spring member 65C into which the bolt 60 is not inserted is positioned by a pin (not illustrated).

Figure 28:
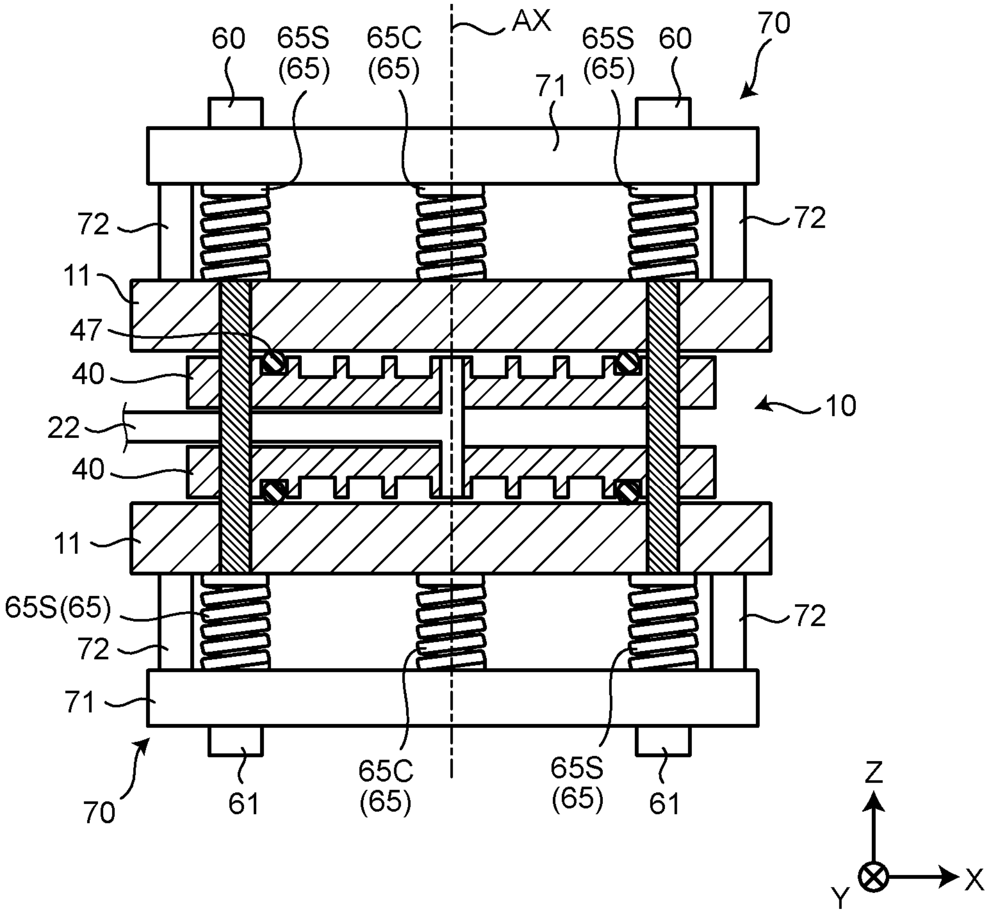
FIG. 28 is a schematic cross-sectional view illustrating the modification example of the main body of the temperature adjustment device according to the third embodiment.

FIG. 28 is a cross-sectional view illustrating a modification example of the main body of the temperature adjustment device according to the third embodiment. In the example illustrated in FIG. 28, a pair of regulation members 70 is arranged with a pair of heat transfer plates 11 being interposed therebetween. Each of the regulation members 70 is configured in the same manner as that is in the third embodiment.

In the above-described embodiment, a main body 10 may be configured by one, or may be configured by connection of three or more.

In the above-described embodiment, a first main body 10A and a second main body 10B may be integrally formed. In this case, the main body has a shape in which the first main body 10A and the second main body 10B are connected.

In the above-described embodiment, a temperature adjustment device 3 adjusts a temperature of liquid LQ. The temperature adjustment device 3 may adjust a temperature of gas. Since the gas is supplied to a channel groove 42, the temperature adjustment device 3 can adjust the temperature of the gas flowing through the channel groove 42 by using a thermoelectric semiconductor element 32.

The invention claimed is:

1. A temperature adjustment device comprising:

a pair of channel plates, each of the pair of channel plates having a front surface and defining a channel groove in at least a part of the front surface;

a pair of heat transfer plates, each of the pair of heat transfer plates facing the channel groove that is defined in one of the pair of channel plates;

a seal member that seals a boundary between the front surface of each of the channel plates and each of the heat transfer plates;

a spacer member arranged to face back surfaces of the channel plates, wherein at least a part of the spacer member is vertically aligned with and disposed below a region of the seal member; and a fastening member that fastens the pair of channel plates and the pair of heat transfer plates in an overlapped state, wherein the spacer member has higher compressive strength than the channel plates.

2. The temperature adjustment device according to claim 1, further comprising regulation members that are arranged on opposite sides of the channel plates with respect to the heat transfer plates and regulate an increase in an interval between the pair of heat transfer plates, wherein the fastening member fastens the regulation members together with the pair of channel plates and the pair of heat transfer plates.

3. The temperature adjustment device according to claim 1, further comprising:

a spring member that biases the pair of heat transfer plates in a direction in which an interval between the pair of heat transfer plates is shortened.

4. The temperature adjustment device according to claim 1, wherein the spacer member has a cross-sectional area having a same size as a cross-sectional area of the seal member.

5. The temperature adjustment device according to claim 1, wherein the spacer member has a cross-sectional area narrower than a cross-sectional area of the seal member.

6. The temperature adjustment device according to claim 1, wherein the spacer member has a cross-sectional area wider than a cross-sectional area of the seal member.

7. The temperature adjustment device according to claim 5, wherein the spacer member is formed in a columnar shape.

8. The temperature adjustment device according to claim 5, wherein the spacer member is formed in a tubular shape.

9. The temperature adjustment device according to claim 1, wherein the spacer member is made of resin or metal.

10. The temperature adjustment device according to claim 1, wherein a plurality of the spacer members is provided along the seal member.

11. The temperature adjustment device according to claim 2, wherein the regulation member includes a base portion arranged in a manner of facing one of the heat transfer plates with a space, and a leg portion extending from the base portion toward the heat transfer plate, and the leg portion extends in a direction in which the pair of channel plates and the pair of heat transfer plates overlap each other.

12. The temperature adjustment device according to claim 3, wherein the fastening member is inserted into the spring member.

13. The temperature adjustment device according to claim 11, further comprising a spring member that biases the pair of heat transfer plates in a direction in which the interval between the pair of heat transfer plates is shortened, wherein the spring member is arranged between the base portion of the regulation member and the heat transfer plate arranged in a manner of facing the base portion.

14. The temperature adjustment device according to claim 6, wherein the spacer member is formed in a columnar shape.

15. The temperature adjustment device according to claim 6, wherein the spacer member is formed in a tubular shape.

16. The temperature adjustment device according to claim 1, wherein the spacer member is aligned with the seal member along an axis perpendicular to the back surfaces of the channel plates.

17. The temperature adjustment device according to claim 1, wherein the spacer member is in contact with the back surfaces of the channel plates.

* * * * *